United States Patent
Hagimoto et al.

(10) Patent No.: US 11,742,374 B2
(45) Date of Patent: Aug. 29, 2023

(54) SEMICONDUCTOR DEVICE, METHOD OF MANUFACTURING SEMICONDUCTOR DEVICE, AND IMAGING ELEMENT

(71) Applicant: SONY SEMICONDUCTOR SOLUTIONS CORPORATION, Kanagawa (JP)

(72) Inventors: Yoshiya Hagimoto, Kanagawa (JP); Nobutoshi Fujii, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 188 days.

(21) Appl. No.: 17/279,962

(22) PCT Filed: Sep. 17, 2019

(86) PCT No.: PCT/JP2019/036321
§ 371 (c)(1),
(2) Date: Mar. 25, 2021

(87) PCT Pub. No.: WO2020/071103
PCT Pub. Date: Apr. 9, 2020

(65) Prior Publication Data
US 2021/0391369 A1 Dec. 16, 2021

(30) Foreign Application Priority Data
Oct. 5, 2018 (JP) .................. 2018-189792

(51) Int. Cl.
*H01L 31/00* (2006.01)
*H01L 27/146* (2006.01)
*H01L 23/00* (2006.01)

(52) U.S. Cl.
CPC ........ *H01L 27/14634* (2013.01); *H01L 24/05* (2013.01); *H01L 24/08* (2013.01);
(Continued)

(58) Field of Classification Search
CPC combination set(s) only.
See application file for complete search history.

(56) References Cited

U.S. PATENT DOCUMENTS

2013/0009321 A1 1/2013 Kagawa et al.
2013/0207271 A1 8/2013 Hagimoto et al.
(Continued)

FOREIGN PATENT DOCUMENTS

CN 102867847 A 1/2013
CN 103247603 A 8/2013
(Continued)

OTHER PUBLICATIONS

International Search Report and Written Opinion of PCT Application No. PCT/JP2019/036321, dated Dec. 10, 2019, 10 pages of ISRWO.

*Primary Examiner* — Niki H Nguyen
(74) *Attorney, Agent, or Firm* — Chip Law Group

(57) ABSTRACT

To provide a semiconductor device having a structure suitable for higher integration. This semiconductor device includes: a first semiconductor substrate; and a second semiconductor substrate. The first semiconductor substrate is provided with a first electrode including a first protruding portion and a first base portion. The first protruding portion includes a first abutting surface. The first base portion is linked to the first protruding portion and has volume greater than volume of the first protruding portion. The second semiconductor substrate is provided with a second electrode including a second protruding portion and a second base portion. The second protruding portion includes a second abutting surface that abuts the first abutting surface. The second base portion is linked to the second protruding portion and has volume greater than volume of the second
(Continued)

protruding portion. The second semiconductor substrate is stacked on the first semiconductor substrate.

10 Claims, 22 Drawing Sheets

(52) U.S. Cl.
CPC .......... *H01L 24/80* (2013.01); *H01L 27/1469* (2013.01); *H01L 2224/03462* (2013.01); *H01L 2224/03845* (2013.01); *H01L 2224/05147* (2013.01); *H01L 2224/05556* (2013.01); *H01L 2224/05564* (2013.01); *H01L 2224/05647* (2013.01); *H01L 2224/08057* (2013.01); *H01L 2224/08121* (2013.01); *H01L 2224/08145* (2013.01); *H01L 2224/80895* (2013.01); *H01L 2224/80935* (2013.01)

(56) References Cited

U.S. PATENT DOCUMENTS

| | | |
|---|---|---|
| 2013/0285253 A1 | 10/2013 | Aoki et al. |
| 2014/0362267 A1 | 12/2014 | Kagawa et al. |
| 2015/0076649 A1* | 3/2015 | Kim ............... H01L 27/14634 257/446 |
| 2015/0108648 A1 | 4/2015 | Tsumura et al. |
| 2015/0187651 A1 | 7/2015 | Aoki et al. |
| 2015/0270212 A1 | 9/2015 | Kagawa et al. |
| 2016/0141267 A1 | 5/2016 | Hagimoto et al. |
| 2016/0141282 A1 | 5/2016 | Jang et al. |
| 2016/0190103 A1 | 6/2016 | Kabe et al. |
| 2016/0343762 A1 | 11/2016 | Kagawa et al. |
| 2016/0343763 A1 | 11/2016 | Kagawa et al. |
| 2017/0354199 A1 | 12/2017 | Hagimoto et al. |
| 2018/0069046 A1 | 3/2018 | Jin |
| 2018/0277585 A1 | 9/2018 | Kagawa et al. |
| 2019/0273109 A1 | 9/2019 | Kagawa et al. |

FOREIGN PATENT DOCUMENTS

| | | | |
|---|---|---|---|
| JP | 2013-33900 A | 2/2013 | |
| JP | 2013-73988 A | 4/2013 | |
| JP | 2013-168419 A | 8/2013 | |
| JP | 2013-229415 A | 11/2013 | |
| JP | 2015-79901 A | 4/2015 | |
| JP | 2017-55049 A | 3/2017 | |
| JP | 2017-135247 A | 8/2017 | |
| JP | 2018-73967 A | 5/2018 | |
| JP | 2018073967 * | 5/2018 | ... H01L 2224/80947 |
| KR | 10-2013-0007972 A | 1/2013 | |
| KR | 10-2016-0057077 A | 5/2016 | |
| TW | 201304064 A | 1/2013 | |
| TW | 201403775 A | 1/2014 | |
| TW | 201517233 A | 5/2015 | |
| TW | 201834069 A | 9/2018 | |
| WO | 2015/040798 A1 | 3/2015 | |
| WO | WO-2018116559 A1 | 6/2018 | |

* cited by examiner

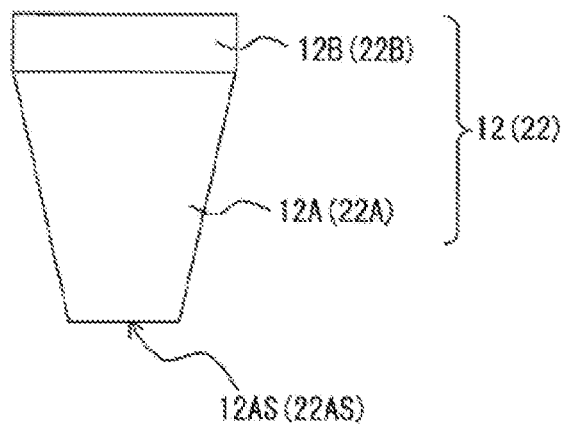
FIG. 15A
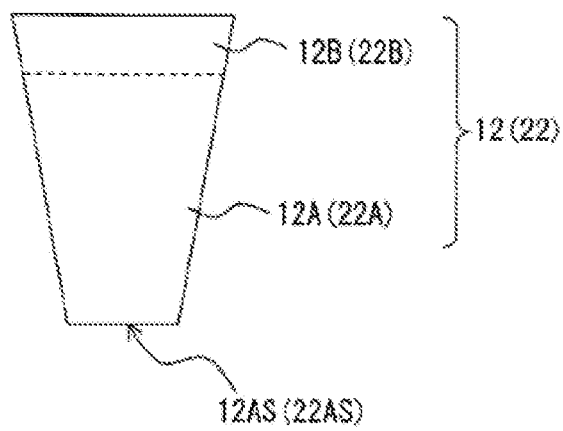
FIG. 15B
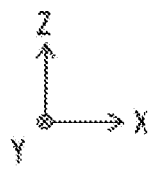
FIG. 15C
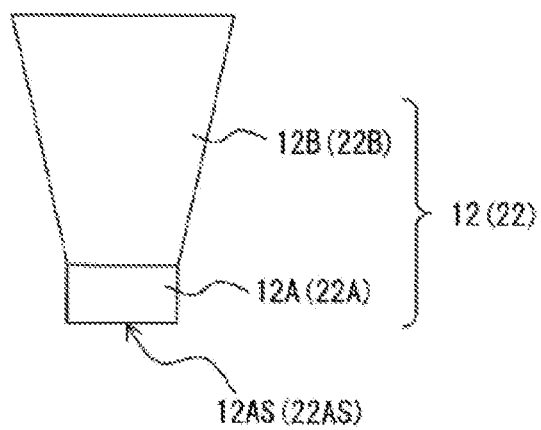

SEMICONDUCTOR DEVICE, METHOD OF MANUFACTURING SEMICONDUCTOR DEVICE, AND IMAGING ELEMENT

CROSS REFERENCE TO RELATED APPLICATIONS

This application is a U.S. National Phase of International Patent Application No. PCT/JP2019/036321 filed on Sep. 17, 2019, which claims priority benefit of Japanese Patent Application No. JP 2018-189792 filed in the Japan Patent Office on Oct. 5, 2018. Each of the above-referenced applications is hereby incorporated herein by reference in its entirety.

TECHNICAL FIELD

The present disclosure relates to a semiconductor device, a method of manufacturing the semiconductor device, and an imaging element.

BACKGROUND ART

The Applicant of the present application has proposed a semiconductor device having a three-dimensional structure in which, for example, a sensor board (first board) and a circuit board (second board) are bonded together and stacked to allow an imaging unit to have higher integration (see, for example, PTL 1). The sensor board (first board) includes a photoelectric conversion element. The circuit board (second board) includes a peripheral circuit. In PTL 1, a first electrode of the first board and a second electrode of the second board are disposed to be opposed to each other with an insulating thin film interposed in between and then heated to be joined together.

CITATION LIST

Patent Literature

PTL 1: Japanese Unexamined Patent Application Publication No. 2013-73988

SUMMARY OF THE INVENTION

Incidentally, further higher integration is requested from such a semiconductor device. It is thus desirable to provide a semiconductor device having a structure suitable for higher integration, a method of manufacturing the semiconductor device, and an imaging element.

A semiconductor device according to an embodiment of the present disclosure includes: a first semiconductor substrate; and a second semiconductor substrate. The first semiconductor substrate is provided with a first electrode including a first protruding portion and a first base portion. The first protruding portion includes a first abutting surface. The first base portion is linked to the first protruding portion and has volume greater than volume of the first protruding portion. The second semiconductor substrate is provided with a second electrode including a second protruding portion and a second base portion. The second protruding portion includes a second abutting surface that abuts the first abutting surface. The second base portion is linked to the second protruding portion and has volume greater than volume of the second protruding portion. The second semiconductor substrate is stacked on the first semiconductor substrate.

In the first electrode of the semiconductor device according to the embodiment of the present disclosure, the volume of the first base portion linked to the first protruding portion including the first abutting surface is greater than the volume of the first protruding portion. In addition, in the second electrode of the semiconductor device according to the embodiment of the present disclosure, the volume of the second base portion linked to the second protruding portion including the second abutting surface is greater than the volume of the second protruding portion. The presence of the first base portion and the second base portion therefore causes the first abutting surface and the second abutting surface to be favorably joined together even in a case where respective planarization processes on the first abutting surface and the second abutting surface partially recess the first abutting surface and the second abutting surface.

BRIEF DESCRIPTION OF DRAWING

FIGS. 15A, 15B, and 15C are enlarged cross-sectional view of a configuration example of a main section of a solid-state imaging unit according to a seventh modification example of the present disclosure.

MODES FOR CARRYING OUT THE INVENTION

The following describes embodiments of the present disclosure in detail with reference to the drawings. It is to be noted that description is given in the following order.
1. First Embodiment (Example of solid-state imaging unit including semiconductor device having two-layer structure in which electrode on sensor board and electrode on circuit board are joined to be opposed to each other)
2. First Modification Example (Example of solid-state imaging unit in which plurality of pixels shares some of electrodes)
3. Second Embodiment (Application Example to Electronic Apparatus)
4. Practical Application Example to Mobile Body
5. Other Modification Examples 1. First Embodiment

[Configuration of Solid-State Imaging Unit 1]

Figure 1:
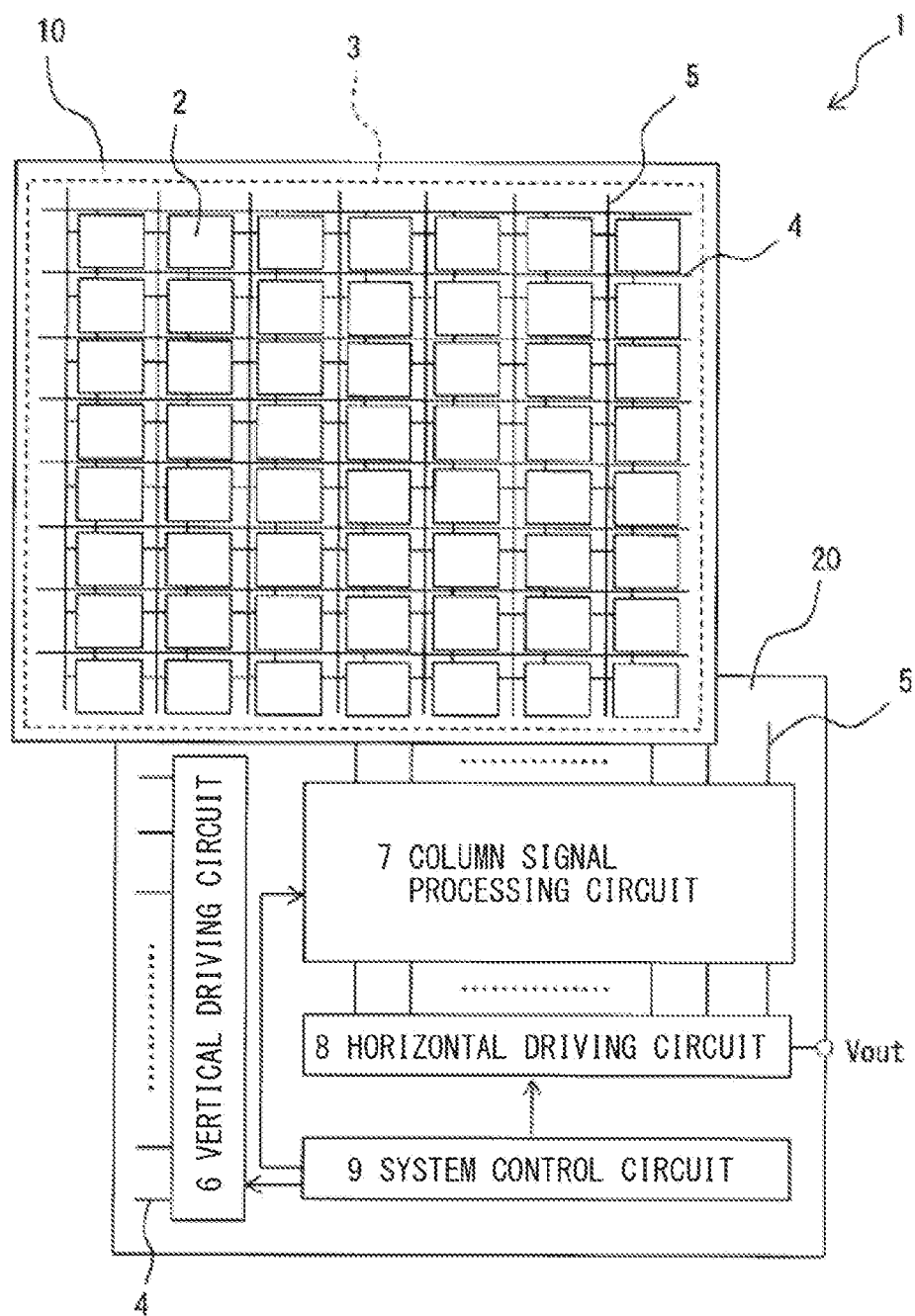
FIG. 1 is a schematic diagram illustrating an overall configuration example of a solid-state imaging unit including a semiconductor device according to an embodiment of the present disclosure.
Figure 2:
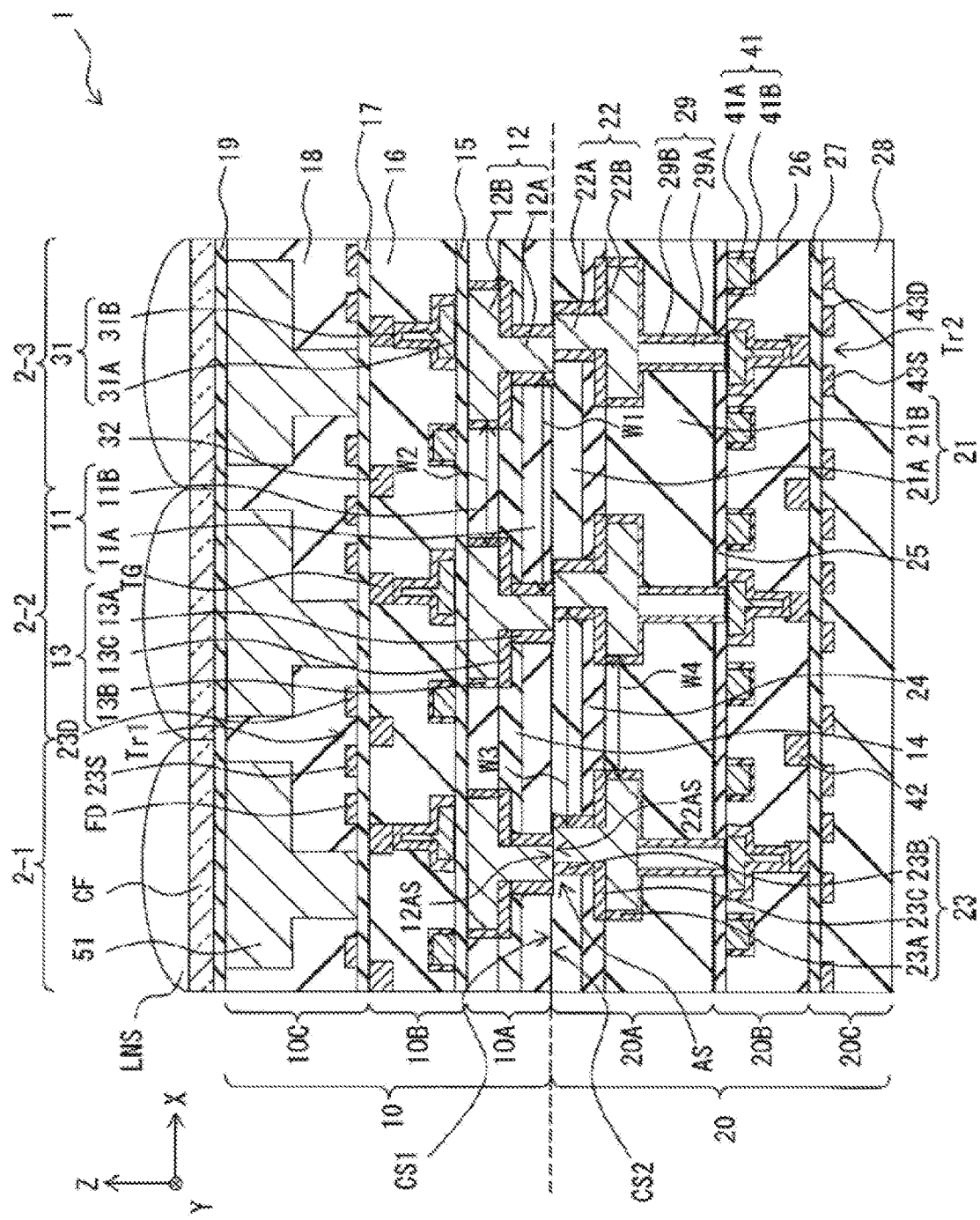
FIG. 2 is a partial cross-sectional view of a configuration example of a main section of the solid-state imaging unit illustrated in FIG. 1.
Figure 3:
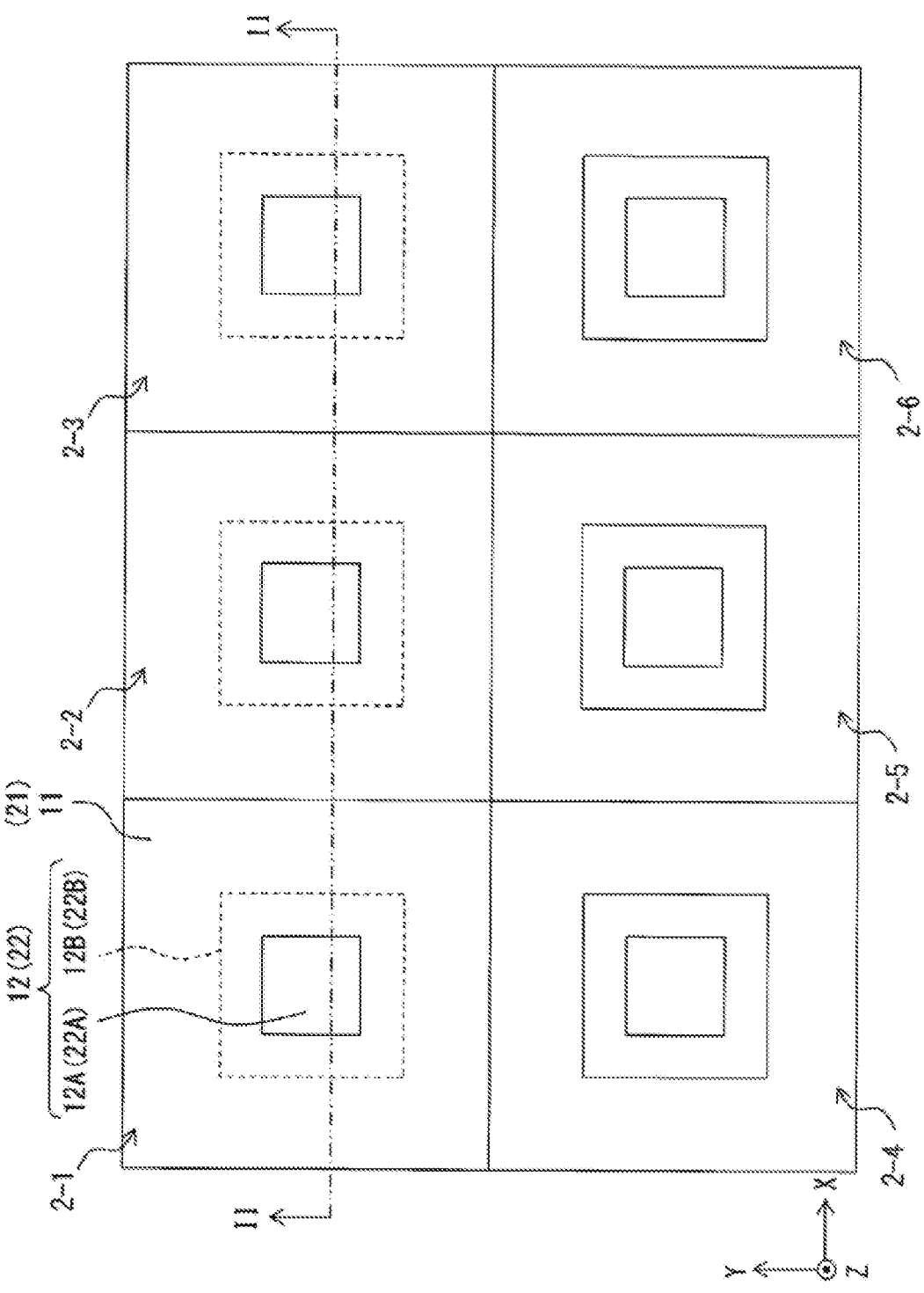
FIG. 3 is a partial plan view of a configuration example of a main section of the solid-state imaging unit illustrated in FIG. 1.

FIG. 1 is a schematic diagram schematically illustrating an overall configuration example of a solid-state imaging unit 1 according to a first embodiment of the present disclosure. FIG. 2 is a partial cross-sectional view of a configuration example of the main section of the solid-state imaging unit 1 illustrated in FIG. 1. In addition, FIG. 3 is a partial plan view of a configuration example of the main section of the solid-state imaging unit 1 on junction surfaces CS1 and CS2 (described below). It is to be noted that FIG. 2 illustrates a cross section taken along a cut line II-II illustrated in FIG. 3 in an arrow direction. FIG. 2, however, exemplifies three pixels 2 (2-1 to 2-3) arranged in an X axis direction. In addition, FIG. 3 illustrates an array including two rows of pixels 2 and three columns of pixels 2. In the array, the three pixels 2 (2-1 to 2-3) arranged in the X axis direction and three pixels 2 (2-4 to 2-6) arranged in the X axis direction in the same way are arranged in a Y axis direction. The solid-state imaging unit 1 is a specific example corresponding to the "semiconductor device" of the present disclosure. The solid-state imaging unit 1 is a semiconductor device having a so-called three-dimensional structure. The semiconductor device includes a sensor board 10 and a circuit board 20. The sensor board 10 serves as a first semiconductor substrate. The circuit board 20 is bonded to this sensor board 10 and stacked in a Z axis direction. The circuit board 20 serves as a second semiconductor substrate. As illustrated in FIG. 2, a protective film 19, a color filter layer CF, and an on-chip lens LNS are stacked in order on the surface of the sensor board 10 opposite to the circuit board 20.

The sensor board 10 is provided with a pixel region 3 in which the plurality of pixels 2 is regularly arrayed two-dimensionally. Each of the plurality of pixels 2 includes an imaging element including a photoelectric conversion section 51 (see FIG. 2). It is to be noted that a region surrounding the pixel region 3 on the sensor board 10 is referred to as peripheral region. This pixel region 3 is provided with a plurality of pixel driving lines 4 extending in the row direction and a plurality of vertical signal lines 5 extending in the column direction. In the solid-state imaging unit 1, for example, each of the pixels 2 is coupled to the one pixel driving line 4 and the one vertical signal line 5. Each of these pixels 2 is provided with a photoelectric conversion section, a floating diffusion, and a pixel circuit including a plurality of transistors (so-called MOS transistors), capacity elements, and the like. It is to be noted that a plurality of the pixels shares a portion of the pixel circuit in some cases.

In addition, the circuit board 20 is provided with peripheral circuits such as a vertical driving circuit 6 for driving the respective pixels 2 provided to the sensor board 10, a column signal processing circuit 7, a horizontal driving circuit 8, and a system control circuit 9. A portion or all of these circuits may be optionally provided to the sensor board 10.

[Configuration of Sensor Board 10]

As illustrated in FIG. 2, the sensor board 10 has a structure in which, for example, an electrode layer 10A, a wiring layer 10B, and a semiconductor layer 10C are stacked. The electrode layer 10A, the wiring layer 10B, and the semiconductor layer 10C are positioned closer to the circuit board 20 in this order.

(Electrode Layer 10A)

The electrode layer 10A includes a first electrode 12 embedded in a first insulating film 11. There is provided a diffusion prevention film 13 on the border between the first insulating film 11 and the first electrode 12. The electrode layer 10A includes the junction surface CS1 opposed to the junction surface CS2 (described below) of the circuit board 20. The junction surface CS1 is planarized, for example, by chemical machine polishing (CMP).

The first electrode 12 is a coupling terminal that is coupled to a second electrode 22 described below to form paired coupling terminals. The first electrode 12 includes a first protruding portion 12A and a first base portion 12B. The first protruding portion 12A includes a first abutting surface 12AS exposed from the junction surface CS1. The first protruding portion 12A stands on the first base portion 12B. The first base portion 12B is linked to the first protruding portion 12A on the opposite side to the first abutting surface 12AS. The first base portion 12B has volume greater than the volume of the first protruding portion 12A. More specifically, as illustrated in FIG. 3, the area occupied by the first base portion 12B is greater than the area occupied by the first protruding portion 12A in an XY plane orthogonal to the Z axis direction that is the stack direction. In addition, the dimensions of the first base portion 12B in an XY plane direction are greater than the dimensions of the first protruding portion 12A in the XY plane direction. The first protruding portion 12A and the first base portion 12B each include the same type of electrically conductive material. The electrically conductive material includes, for example, a highly electrically conductive non-magnetic material such as Cu (copper). In addition, a distance W1 between the first protruding portions 12A of the two adjacent first electrodes 12 is equal to or greater than a distance W2 between the first base portions 12B. Each of FIGS. 1 to 3 illustrates a case where the distance W1 is longer than the distance W2. It is to be noted that the one pixel 2 is provided with the one first electrode 12 in FIG. 2, but the two or more pixels 2 may also be provided with the one first electrode 12.

The first insulating film 11 includes an insulating layer 11A and an insulating layer 11B. The insulating layer 11A is provided in the same layer as the layer of the first protruding portion 12A to surround the first protruding portion 12A. The insulating layer 11B is provided in the same layer as the layer of the first base portion 12B to surround the first base portion 12B. The insulating layer 11A and the insulating layer 11B each include, for example, a TEOS film. The TEOS film refers to a silicon oxide film formed by using chemical vapor deposition (referred to as CVD below) in which TEOS gas (Tetra Ethoxy Silane gas: a composition of $Si(OC_2H_5)_4$) is used as raw material gas.

There is provided a diffusion prevention layer 14 in a layer between the insulating layer 11A and the insulating layer 11B to separate the insulating layer 11A and the insulating layer 11B and separate the insulating layer 11A and the first base portion 12B. The diffusion prevention layer 14 is formed by using a material that suppresses the diffusion of a material included in the first electrode 12 to the first insulating film 11. Examples of the material that suppresses the diffusion include an insulating material such as SiCN. Specifically, the diffusion prevention layer 14 is formed by using, for example, a vapor-phase method such as CVD or sputtering. It is to be noted that there may be a first insulating film in place of the diffusion prevention layer 14.

The diffusion prevention film 13 includes a diffusion prevention layer 13A, a diffusion prevention layer 13B, and a diffusion prevention layer 13C. The diffusion prevention layer 13A is provided to separate the first protruding portion 12A and the insulating layer 11A. The diffusion prevention layer 13B is provided to separate the first base portion 12B and the insulating layer 11B. The diffusion prevention layer 13C covers the first base portion 12B to connect the diffusion prevention layer 13A and the diffusion prevention layer 13B. Each of the diffusion prevention layers 13A to 13C is formed by using a material that suppresses the diffusion of a material included in the first electrode 12 to the first insulating film 11. A material including, for example, at least one of Ti (titanium), TiN (titanium nitride), Ta (tantalum), or TaN (tantalum nitride) is preferred as a material included in each of the diffusion prevention layers 13A to 13C. In addition, each of the diffusion prevention layers 13A to 13C may be formed by using a plurality of layers.

(Wiring Layer 10B)

The wiring layer 10B includes an insulating layer 15 and an insulating layer 16. The insulating layer 15 and the insulating layer 16 are stacked in order on the electrode layer 10A. For example, a wiring line 31 is embedded in the insulating layer 16. The wiring line 31 includes a wiring layer 31A and a barrier metal layer 31B. The wiring layer 31A includes a highly electrically conductive material such as Cu (copper). The barrier metal layer 31B surrounds the wiring layer 31A. The barrier metal layer 31B suppresses the diffusion of a material included in the wiring layer 31A. Further, for example, a transfer gate TG of a transfer transistor and a gate electrode 32 of a pixel transistor Tr1 are embedded near the surface of the insulating layer 16 opposite to the electrode layer 10A. The pixel transistor Tr1 is, for example, any of an amplification transistor, a reset transistor, or a selection transistor.

(Semiconductor Layer 10C)

The semiconductor layer 10C includes an insulating layer 17 and a semiconductor layer 18. The insulating layer 17 covers the wiring layer 10B. The semiconductor layer 18 covers the insulating layer 17. The semiconductor layer 18 includes single-crystal silicon and the like. There are provided a source 23S and a drain 23D of the pixel transistor Tr1 and a floating diffusion FD near the surface of the semiconductor layer 18 opposed to the wiring layer 10B. The source 23S and the drain 23D of the pixel transistor Tr1 and the floating diffusion FD are positioned on the opposite side to the gate electrode 32 with the insulating layer 17 interposed in between. The semiconductor layer 18 is further provided with the photoelectric conversion section 51 for each of the pixels 2.

[Configuration of Circuit Board 20]

As illustrated in FIG. 2, the circuit board 20 has a structure in which, for example, an electrode layer 20A, a wiring layer 20B, and a semiconductor layer 20C are stacked. The electrode layer 20A, the wiring layer 20B, and the semiconductor layer 20C are positioned closer to the sensor board 10 in this order.

(Electrode Layer 20A)

The electrode layer 20A includes the second electrode 22 embedded in a second insulating film 21. There is provided a diffusion prevention film 23 on the border between the second insulating film 21 and the second electrode 22. The electrode layer 20A includes the junction surface CS2 opposed to the junction surface CS1 of the sensor board 10. The junction surface CS2 is also planarized, for example, by chemical machine polishing (CMP) as with the junction surface CS1.

The second electrode 22 is a coupling terminal that is coupled to the first electrode 12 to form paired coupling terminals. The second electrode 22 includes a second protruding portion 22A and a second base portion 22B. The formation of the paired coupling terminals of the first electrode 12 and the second electrode 22 in this way allows signals to be exchanged between the sensor board 10 and the circuit board 20. The second protruding portion 22A includes a second abutting surface 22AS exposed from the junction surface CS2. The second protruding portion 22A stands on the second base portion 22B. The second base portion 22B is linked to the second protruding portion 22A on the opposite side to the second abutting surface 22AS. The second base portion 22B has volume greater than the volume of the second protruding portion 22A. More specifically, as illustrated in FIG. 3, the area occupied by the second base portion 22B is greater than the area occupied by the second protruding portion 22A in the XY plane orthogonal to the Z axis direction that is the stack direction. In addition, the dimensions of the second base portion 22B in the XY plane direction are greater than the dimensions of the second protruding portion 22A in the XY plane direction. The second protruding portion 22A and the second base portion 22B each include the same type of electrically conductive material. The electrically conductive material includes, for example, a highly electrically conductive non-magnetic material such as Cu (copper). In addition, a distance W3 between the second protruding portions 22A of the two adjacent second electrodes 22 is equal to or greater than a distance W4 between the second base portions 22B. Each of FIGS. 1 to 3 illustrates a case where the distance W3 is longer than the distance W4. It is to be noted that the one pixel 2 is provided with the one second electrode 22 in FIG. 2, but the two or more pixels 2 may also be provided with the one second electrode 22.

As described above, the sensor board 10 includes the pixel region 3 in which the plurality of pixels 2 is formed and the peripheral region that surrounds the pixel region 3. Abutting sections AS of the first abutting surface 12AS and the second abutting surface 22AS are formed in a region overlapping with the pixel region 3 on the sensor board 10 in the stack direction (Z axis direction). The abutting sections AS are joined by using, for example, plasma junction.

The second insulating film 21 includes an insulating layer 21A and an insulating layer 21B. The insulating layer 21A is provided in the same layer as the layer of the second protruding portion 22A to surround the second protruding portion 22A. The insulating layer 21B is provided in the same layer as the layer of the second base portion 22B to surround the second base portion 22B. The insulating layer 21A and the insulating layer 21B each include, for example, a TEOS film.

There is provided a diffusion prevention layer 24 in a layer between the insulating layer 21A and the insulating layer 21B to separate the insulating layer 21A and the insulating layer 21B and separate the insulating layer 21A and the second base portion 22B. The diffusion prevention layer 24 is formed by using a material that suppresses the diffusion of a material included in the second electrode 22 to the second insulating film 21. Examples of the material that suppresses the diffusion include an insulating material such as SiCN. Specifically, the diffusion prevention layer 24 is formed by using, for example, a vapor-phase method such as CVD or sputtering. It is to be noted that the second insulating film 21 may be provided in place of the diffusion prevention layer 24.

The diffusion prevention film 23 includes a diffusion prevention layer 23A, a diffusion prevention layer 23B, and a diffusion prevention layer 23C. The diffusion prevention layer 23A is provided to separate the second protruding portion 22A and the insulating layer 21A. The diffusion prevention layer 23B is provided to separate the second base portion 22B and the insulating layer 21B. The diffusion prevention layer 23C covers the second base portion 22B to connect the diffusion prevention layer 23A and the diffusion prevention layer 23B. Each of the diffusion prevention layers 23A to 23C is formed by using a material that suppresses the diffusion of a material included in the second electrode 22 to the second insulating film 21. A material including, for example, at least one of Ti (titanium), TiN (titanium nitride), Ta (tantalum), or TaN (tantalum nitride) is preferred as a material included in each of the diffusion prevention layers 23A to 23C. In addition, each of the diffusion prevention layers 23A to 23C may be formed by using a plurality of layers.

(Wiring Layer 20B)

The wiring layer 20B includes an insulating layer 25 and an insulating layer 26. The insulating layer 25 covers the surface of the electrode layer 20A opposite to the junction surface CS2. The insulating layer 26 is provided below the insulating layer 25. For example, a wiring line 41 is embedded in the insulating layer 26. The wiring line 41 includes a wiring layer 41A and a barrier metal layer 41B. The wiring layer 41A includes a highly electrically conductive material such as Cu (copper). The barrier metal layer 41B surrounds the wiring layer 41A. The barrier metal layer 41B suppresses the diffusion of a material included in the wiring layer 41A. It is to be noted that the wiring layer 41A is coupled to the second base portion 22B of the second electrode 22 by a wiring line 29 that penetrates the insulating layer 21B and the insulating layer 25. The wiring line 29 includes a wiring layer 29A and a barrier metal layer 29B. The wiring layer 29A includes a highly electrically conductive material such as Cu (copper). The barrier metal layer 29B surrounds the wiring layer 29A. The barrier metal layer 29B suppresses the diffusion of a material included in the wiring layer 29A. Further, for example, a gate electrode 42 of a transistor Tr2 in a logic circuit such as the column signal processing circuit 7 is embedded near the surface of the insulating layer 26 opposite to the electrode layer 20A.

(Semiconductor Layer 20C)

The semiconductor layer 20C includes an insulating layer 27 and a semiconductor layer 28. The insulating layer 27 covers the wiring layer 20B. The semiconductor layer 28 covers the insulating layer 27. The semiconductor layer 28 includes single-crystal silicon and the like. There are provided a source 43S and a drain 43D of the transistor Tr2 near the surface of the semiconductor layer 28 opposed to the wiring layer 20B. The source 43S and the drain 43D of the transistor Tr2 are positioned on the opposite side to the gate electrode 42 with the insulating layer 27 interposed in between.

[Protective Film 19, Color Filter Layer CF, and On-Chip Lens LNS]

The protective film 19 is provided to cover the photoelectric conversion section 51 of the sensor board 10. The protective film 19 is a material film having a passivation property. Examples of a material included therein include silicon oxide, silicon nitride, silicon oxynitride, or the like. The color filter layer CF is a color filter for each color. The color filter is provided in association with each photoelectric conversion section 51 on a one-to-one basis. There is no limitation on the array of the color filters for the respective colors. The on-chip lens LNS is provided in association with each photoelectric conversion section 51 and each color filter layer CF on a one-to-one basis. The on-chip lens LNS is configured to collect incident light in each photoelectric conversion section 51.

[Method of Manufacturing First Electrode 12]

Next, with reference to FIGS. 4A to 4E, a method of manufacturing the first electrode 12 on the sensor board 10 is described.

Figure 4A:
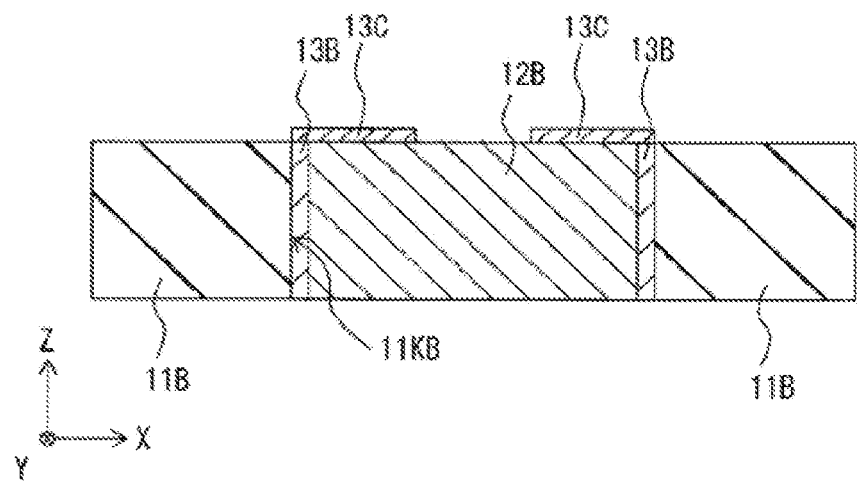
FIG. 4A is an enlarged cross-sectional view of a step in a method of manufacturing the solid-state imaging unit illustrated in FIG. 1.

First, as illustrated in FIG. 4A, the diffusion prevention layer 13B and the first base portion 12B are formed one by one to fill an opening 11KB provided at a predetermined position in the insulating layer 11B. The first base portion 12B is embedded, for example, in a damascene method. Further, the diffusion prevention layer 13C is selectively formed on the diffusion prevention layer 13B and the first base portion 12B.

Figure 4B:
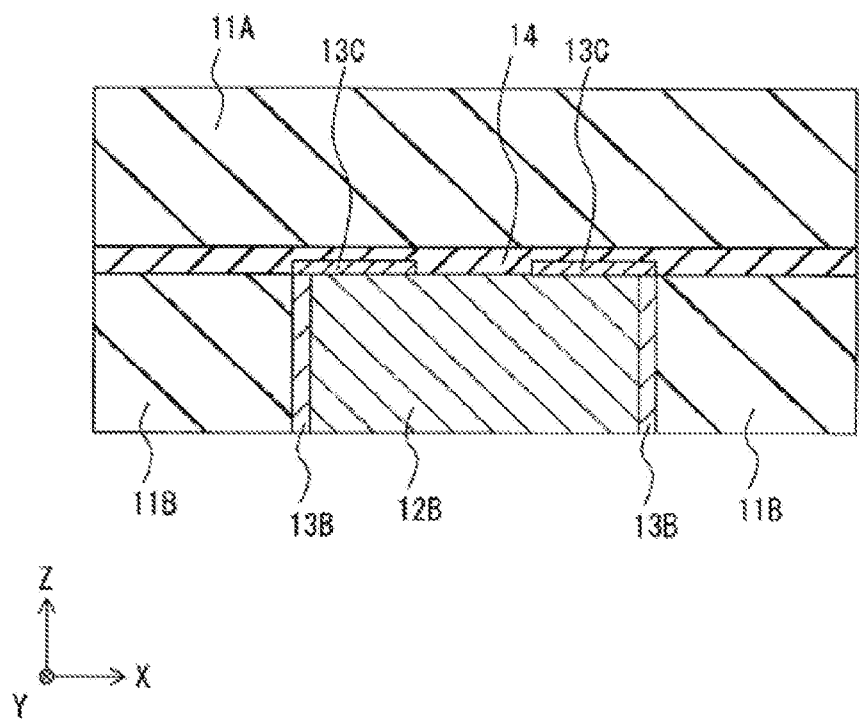
FIG. 4B is an enlarged cross-sectional view of a step subsequent to FIG. 4A.

Next, as illustrated in FIG. 4B, the diffusion prevention layer 14 is formed, for example, by CVD or sputtering to cover the insulating layer 11B, the diffusion prevention layer 13B, the diffusion prevention layer 13C, and the first base portion 12B. After that, the insulating layer 11A is formed to cover the diffusion prevention layer 14.

Figure 4C:
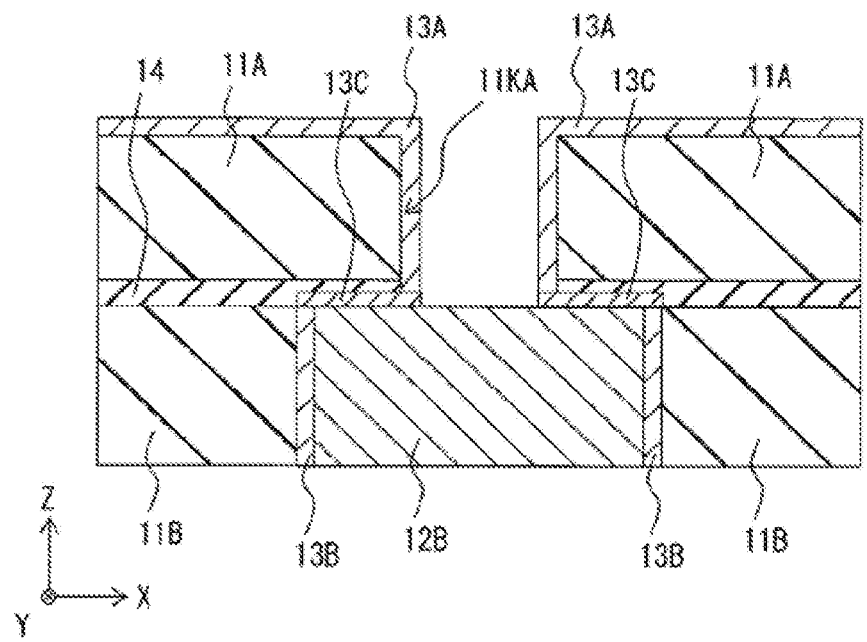
FIG. 4C is an enlarged cross-sectional view of a step subsequent to FIG. 4B.

Next, as illustrated in FIG. 4C, an opening 11KA is formed, for example, by selective dry etching at the position corresponding to the first base portion 12B. After that, the diffusion prevention layer 13A is formed by sputtering or the like to cover the side surface of the opening 11KA and the upper surface of the insulating layer 11A.

Figure 4D:
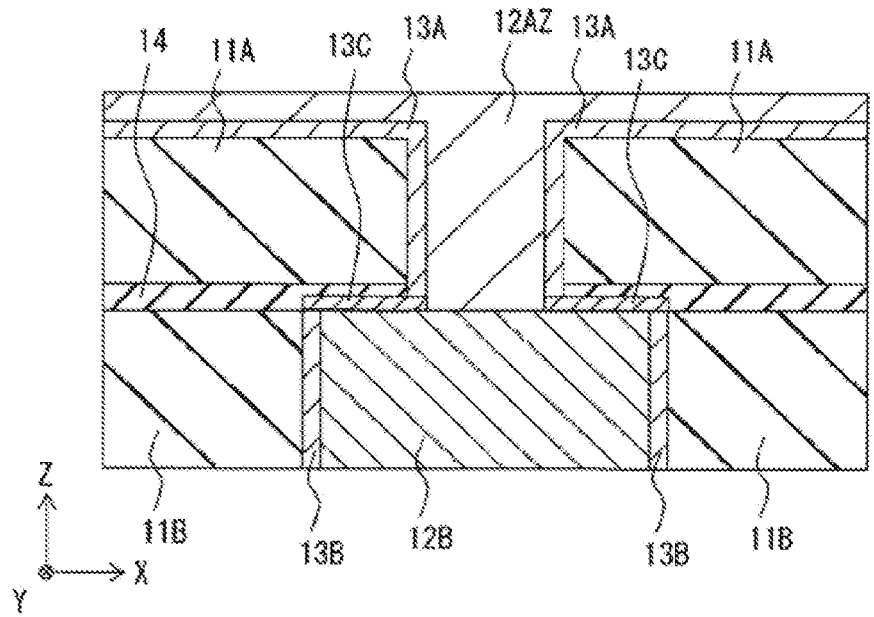
FIG. 4D is an enlarged cross-sectional view of a step subsequent to FIG. 4C.

Next, as illustrated in FIG. 4D, a metal layer 12AZ is formed, for example, in an electrolytic plating method to fill the opening 11KA.

Figure 4E:
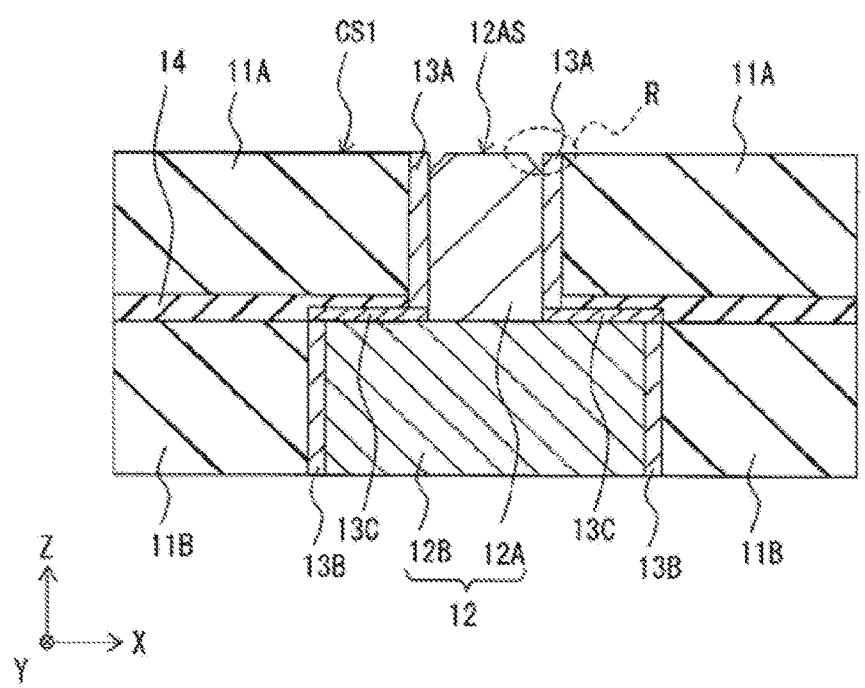
FIG. 4E is an enlarged cross-sectional view of a step subsequent to FIG. 4D.

After that, as illustrated in FIG. 4E, a portion of the metal layer 12AZ overflowing from the opening 11KA and the diffusion prevention layer 13A covering the upper surface of the insulating layer 11A are polished, for example, by CMP to form the junction surface CS1 including the planarized first abutting surface 12AS. This completes the first electrode 12 including the first protruding portion 12A. The polishing described above sometimes generates a recess portion R at an end of the first abutting surface 12AS of the first protruding portion 12A. The recess portion R is recessed from the junction surface CS1. It is to be noted that it is possible to form the second electrode 22 on the circuit board 20 in a similar procedure.

[Method of Joining Sensor Board 10 and Circuit Board 20]

Figure 4F:
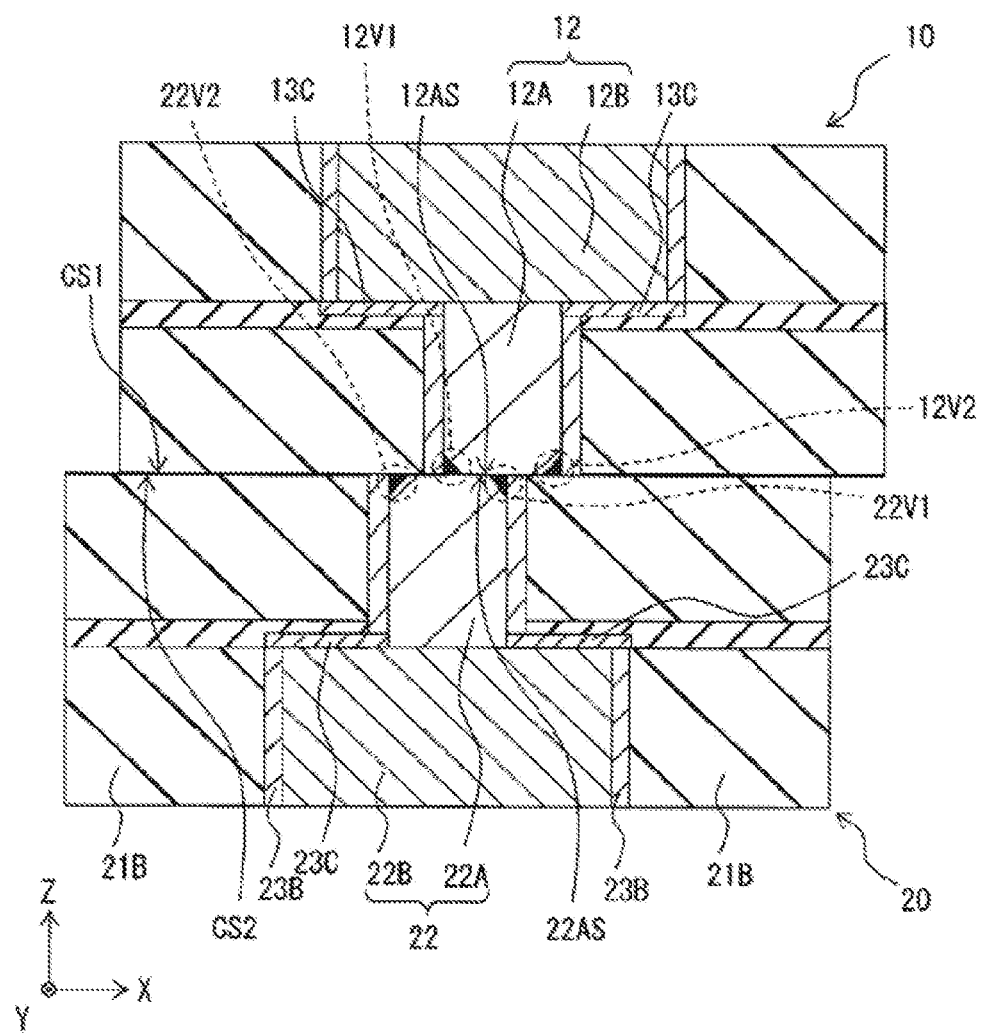
FIG. 4F is an enlarged cross-sectional view of a step subsequent to FIG. 4E.
Figure 4G:
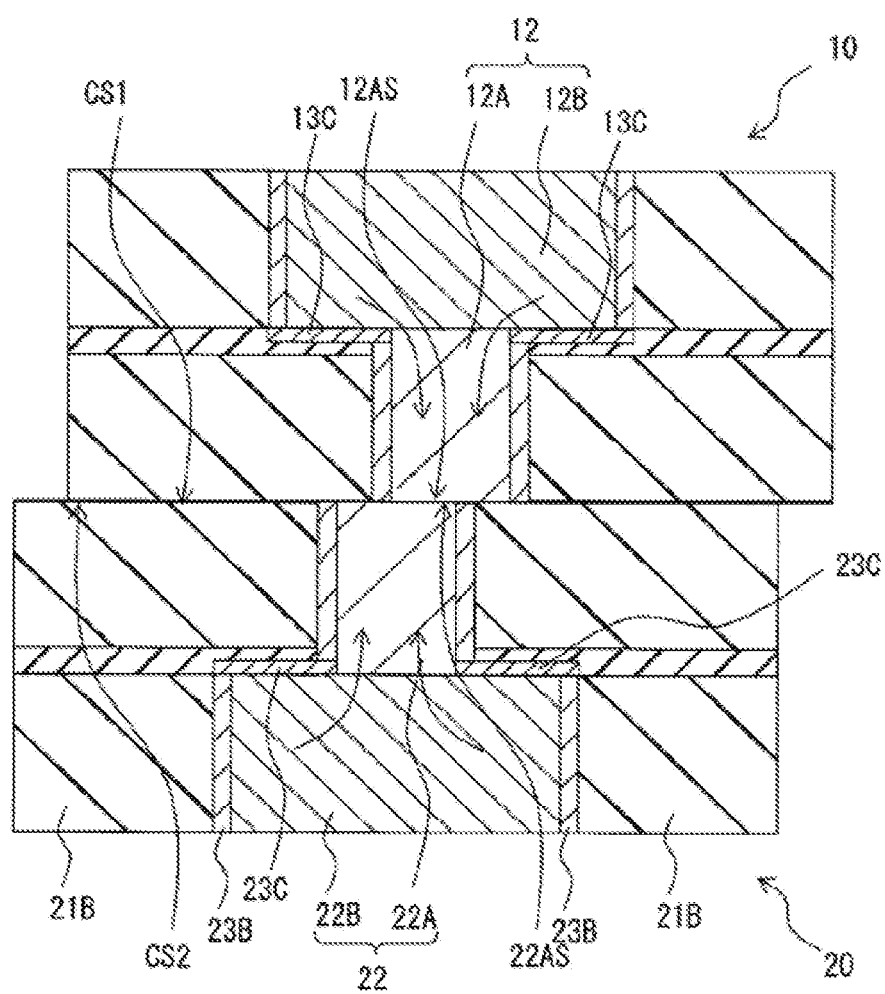
FIG. 4G is an enlarged cross-sectional view of a step subsequent to FIG. 4F.

Next, with reference to FIGS. 4F and 4G, a method is described of joining the sensor board 10 and the circuit board 20.

First, as illustrated in FIG. 4F, the sensor board 10 and the circuit board 20 are positioned in the XY plane. The junction surface CS1 and the junction surface CS2 are made opposed to each other to make the first abutting surface 12AS and the second abutting surface 22AS face each other. For example, plasma junction is performed in the state to join the junction surface CS1 and the junction surface CS2. In that case, the presence of the recess portions R causes gaps 12V1, 12V2, 22V1, and 22V2 to be generated between the sensor board 10 and the circuit board 20. It is to be noted that the gap 12V1 is a space formed between the recess portion R of the first abutting surface 12AS and the planarized portion of the second abutting surface 22AS. The gap 22V1 is a space formed between the recess portion R of the second abutting surface 22AS and the planarized portion of the first abutting surface 12AS. The gap 12V1 and the gap 22V1 sometimes overlap with each other in the Z axis direction. In addition, the gap 12V2 is a space formed between the recess portion R of the first abutting surface 12AS and a portion of the junction surface CS2 other than the second abutting surface 22AS. Further, the gap 22V2 is a space formed between the recess portion R of the second abutting surface 22AS and a portion of the junction surface CS1 other than the first abutting surface 12AS.

After that, annealing treatment is performed, for example, at a temperature of about 400° C. This annealing treatment fills the gaps 12V1, 12V2, 22 V1, and 22V2 as illustrated in FIG. 4G and forms the sufficiently contacted abutting sections AS. This allows for favorable electrical conduction between the first electrode 12 and the second electrode 22. It is to be noted that the gaps 12V1, 12V2, 22 V1, and 22V2 are considered to be filled because heating causes Cu (copper) to move from the first base portion 12B to the first protruding portion 12A and causes Cu (copper) to move from the second base portion 22B to the second protruding portion 22A. In other words, a resultant increase in the volume of the first protruding portion 12A and a resultant increase in the volume of the second protruding portion 22A seem to cause the gaps 12V1, 12V2, 22 V1, and 22V2 to disappear. It is to be noted that FIG. 4G illustrates, as an example, that all of the gaps 12V1, 12V2, 22 V1, and 22V2 disappear, but the gaps 12V2 and 22V2 may remain even after annealing treatment.

[Workings and Effects of Solid-State Imaging Unit 1]

In the first electrode 12 on the sensor board 10 of the solid-state imaging unit 1 according to the present embodiment, the volume of the first base portion 12B linked to the first protruding portion 12A including the first abutting surface 12AS is greater than the volume of the first protruding portion 12A. Similarly, in the second electrode 22, the volume of the second base portion 22B linked to the second protruding portion 22A including the second abutting surface 22AS is greater than the volume of the second protruding portion 22A. The presence of the first base portion 12B and the second base portion 22B therefore causes the first abutting surface 12AS and the second abutting surface 22AS to be favorably joined together even in a case where respective planarization processes on the first abutting surface 12AS and the second abutting surface 22AS partially recess the first abutting surface and the second abutting surface to generate the recess portions R. This securely couples the first electrode 12 and the second electrode 22 electrically. This makes it possible to securely couple the first electrode 12 and the second electrode 22 electrically even in a case where the sensor board 10 and the circuit board 20 are smaller and the first electrode 12 and the second electrode 22 are finer. In addition, this allows for secure electrical coupling even in a case of mismatch bonding positions. In other words, the solid-state imaging unit 1 is able to address further higher integration.

In addition, it is possible in the solid-state imaging unit 1 to decrease the area of each of the junction portions of the first abutting surface 12AS of the first electrode 12 and the second abutting surface 22AS of the second electrode 22. It is possible to provide even a finer pixel region with paired coupling terminals for each of pixels or for a desired number of pixels. This makes it possible as a result to contribute to the miniaturization and higher integration of the solid-state imaging unit 1.

2. Modification Example of First Embodiment

Figure 5:
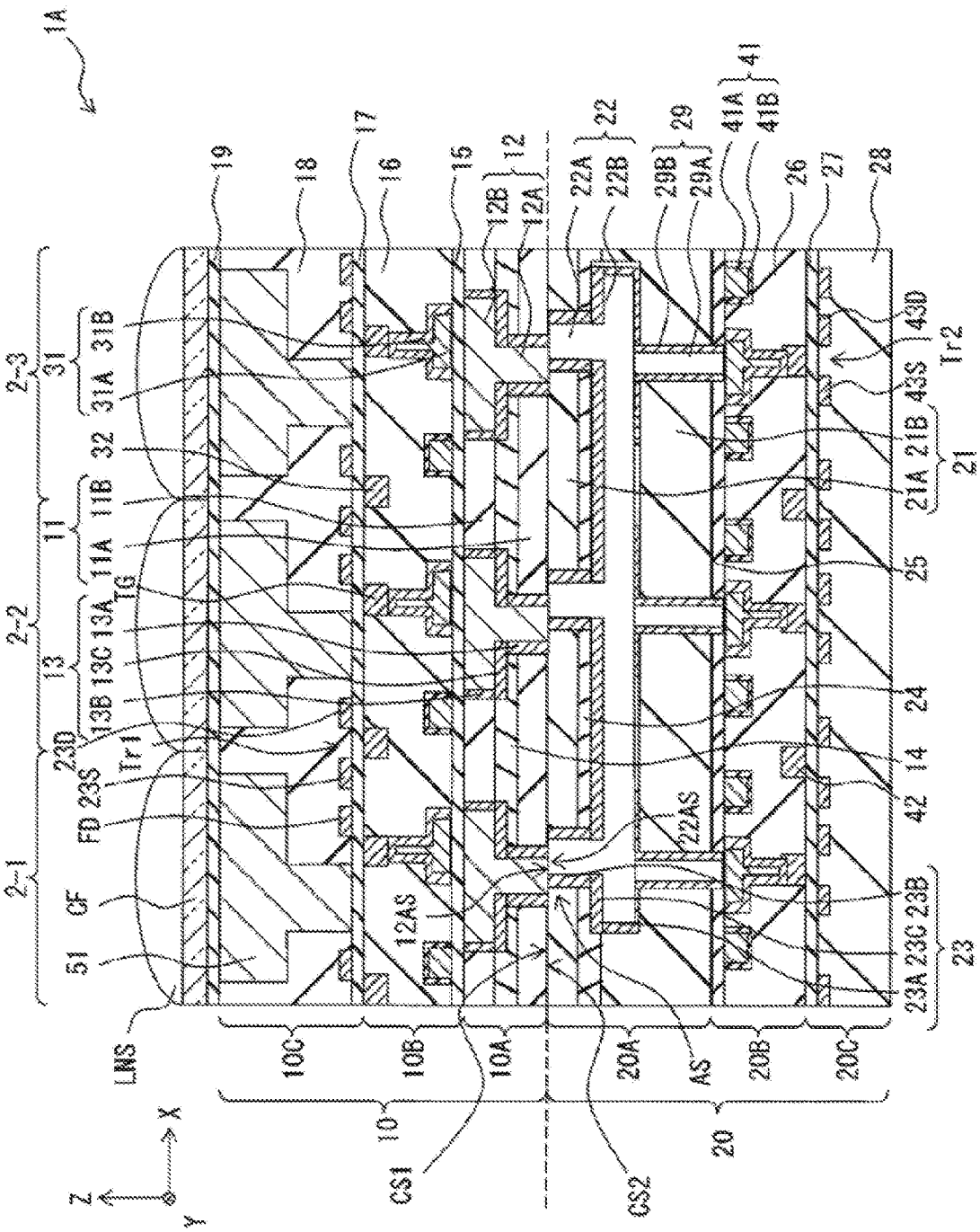
FIG. 5 is a cross-sectional view of an overall configuration example of a solid-state imaging unit according to a first modification example of the present disclosure.

FIG. 5 is a schematic diagram schematically illustrating an overall configuration example of a solid-state imaging unit 1A according to a modification example of the first embodiment of the present disclosure. In this solid-state imaging unit 1A, some of the plurality of pixels 2 share the second base portion 22B of the second electrode 22. In other words, the second electrode 22 includes the plurality of second protruding portions 22A linked to the one second base portion 22B. The solid-state imaging unit 1A having such a configuration allows the plurality of pixels 2 sharing the one second base portion 22B to be concurrently driven. In addition, it is possible to concurrently transmit pixel signals to the circuit board 20 from the plurality of pixels 2 that shares the one second base portion 22B. Although not illustrated, the first electrode 12 may also have a configuration in which the plurality of first protruding portions 12A is linked to the one first base portion 12B as with the second electrode 22. Further, it is also possible to combine both. Adopting such a mode makes it possible to decrease the area of each of the junction portions of the first electrode 12 and the second electrode 22 and further decrease at least one of the area of the first base portion 12B or the area of the second base portion 22B. As a result, it is possible to decrease the wiring area of at least one of the sensor board 10 or the circuit board 20. In addition, it is also possible to share a portion (e.g., comparator, counter, or the like) of the column signal processing circuit 7 that performs AD conversion between the plurality of pixels 2, making it possible to contribute to a decrease in the area of the logic circuit on the circuit board 20. This makes it possible as a result to contribute to the miniaturization and higher integration of the solid-state imaging unit 1A.

3. Second Embodiment: Application Example to Electronic Apparatus

Figure 6:
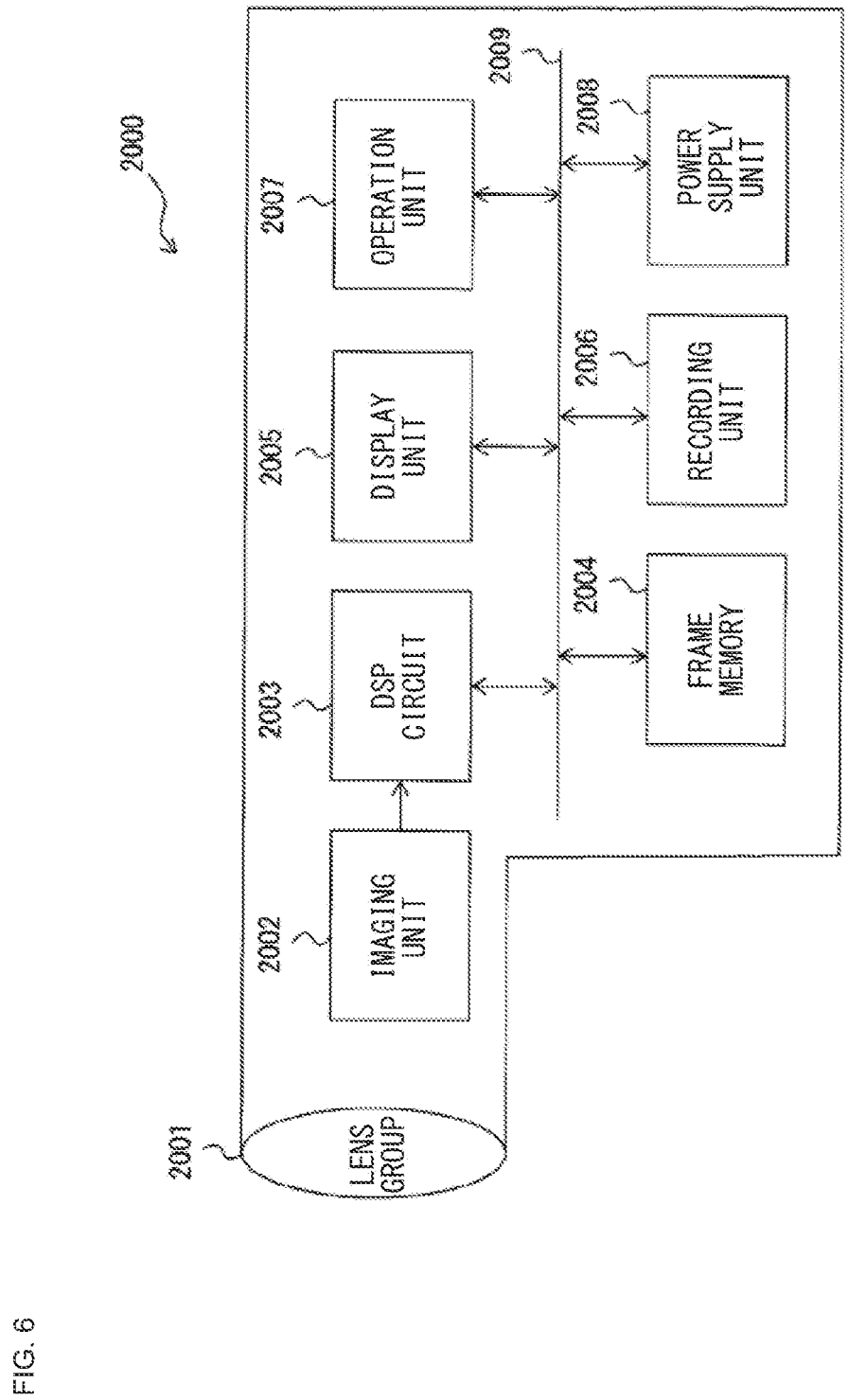
FIG. 6 is a schematic diagram illustrating an overall configuration example of an electronic apparatus according to a second embodiment of the present disclosure.

FIG. 6 is a block diagram illustrating a configuration example of a camera 2000 serving as an electronic apparatus to which the present technology is applied.

The camera 2000 includes an optical unit 2001 including a lens group and the like, an imaging unit (imaging device) 2002 to which the solid-state imaging unit 1, 1A, or the like (that is referred to as solid-state imaging unit 1 or the like below) described above is applied, and a DSP (Digital Signal Processor) circuit 2003 that is a camera signal processing circuit. In addition, the camera 2000 also includes a frame memory 2004, a display unit 2005, a recording unit 2006, an operation unit 2007, and a power supply unit 2008. The DSP circuit 2003, the frame memory 2004, the display unit 2005, the recording unit 2006, the operation unit 2007, and the power supply unit 2008 are coupled to each other via a bus line 2009.

The optical unit 2001 takes in incident light (image light) from a subject to form an image on an imaging surface of the imaging unit 2002. The imaging unit 2002 converts the amount of incident light formed, as an image, on the imaging surface by the optical unit 2001 into an electric signal on a pixel unit basis and outputs the converted electric signal as a pixel signal.

The display unit 2005 includes, for example, a panel-type display device such as a liquid crystal panel or an organic EL panel and displays a moving image or a still image captured by the imaging unit 2002. The recording unit 2006 records the moving image or the still image captured by the imaging unit 2002 in a recording medium such as a hard disk or a semiconductor memory.

The operation unit 2007 issues an operation instruction about a variety of functions of the camera 2000 under an operation of a user. The power supply unit 2008 appropriately supplies the DSP circuit 2003, the frame memory 2004, the display unit 2005, the recording unit 2006, and the operation unit 2007 with various types of power for operations of these supply targets.

As described above, the use of the solid-state imaging unit 1 or the like described above as the imaging unit 2002 makes it possible to expect a favorable image.

4. Practical Application Example to Mobile Body

The technology (the present technology) according to the present disclosure is applicable to a variety of products. For example, the technology according to the present disclosure may be achieved as a device mounted on any type of mobile body such as an automobile, an electric vehicle, a hybrid electric vehicle, a motorcycle, a bicycle, a personal mobility, an airplane, a drone, a vessel, or a robot.

Figure 7:
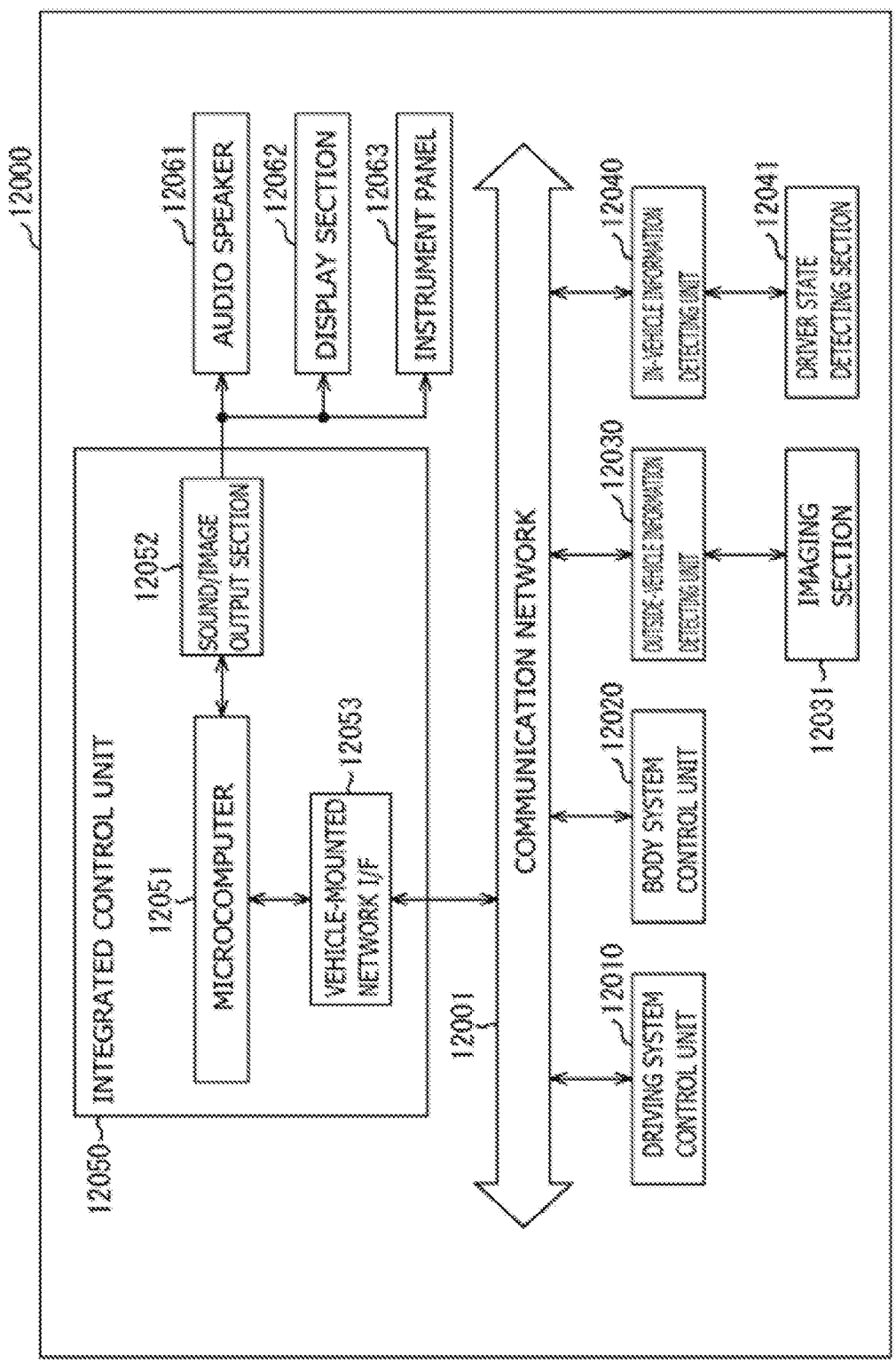
FIG. 7 is a block diagram depicting an example of schematic configuration of a vehicle control system.

FIG. 7 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 7, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 7, an audio speaker 12061, a display section 12062, and an instrument panel 12063 are illustrated as the output device. The display section 12062 may, for example, include at least one of an on-board display and a head-up display.

Figure 8:
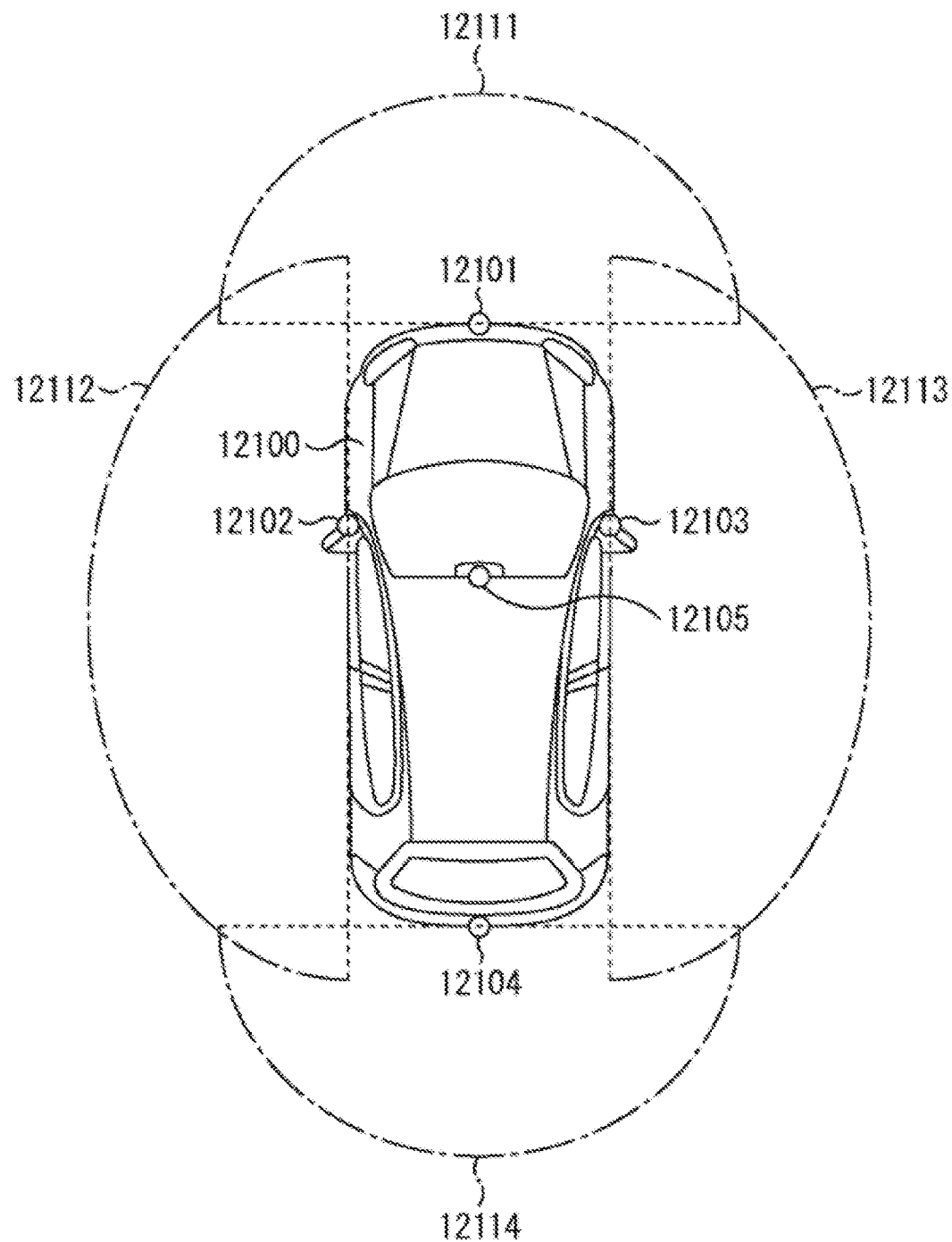
FIG. 8 is a diagram of assistance in explaining an example of installation positions of an outside-vehicle information detecting section and an imaging section.

FIG. 8 is a diagram depicting an example of the installation position of the imaging section 12031.

In FIG. 8, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 8 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The above has described the example of the vehicle control system to which the technology according to the present disclosure may be applied. The technology according to the present disclosure may be applied to the imaging section 12031 among the components described above. Specifically, the solid-state imaging unit 1 or the like illustrated in FIG. 1 or the like is applicable to the imaging section 12031. It is possible to expect an excellent operation of the vehicle control system by applying the technology according to the present disclosure to the imaging section 12031.

5. Other Modification Examples

Although the present disclosure has been described above with reference to several embodiments and modification examples, the present disclosure is not limited to the embodiments and the like described above. It is possible to make a variety of modifications. For example, the solid-state imaging unit 1 has been exemplified that has a two-layer structure of the sensor board 10 and the circuit board 20 in the embodiments described above. The present disclosure is not, however, limited to this. The present disclosure is applicable, for example, to a stacked structure of three or more layers.

In addition, any disposition positions, dimensions, and shapes may be set for the respective components of the sensor board 10 and of the circuit board 20 described in the embodiments and the like above. For example, FIG. 1 or the like illustrates that the first electrode 12 or the second electrode 22 has an end surface parallel to the stack direction (Z axis direction), but the present disclosure is not limited to this. For example, a tapered end surface may be formed for each of them. It is to be noted that the first protruding portion of the first electrode and the second protruding portion of the second electrode are each considered to have, for example, a dimension of about several μm to sub-μm. The technology according to the present disclosure is not, however, applied to such a dimension in a limited manner. In addition, the case has been exemplified in the embodiments and the like described above where a portion of the first abutting surface of the first electrode and a portion of the second abutting surface of the second electrode are joined together. The whole of the first abutting surface and the whole of the second abutting surface may be, however, joined together. In other words, the size of the first abutting surface and the size of the second abutting surface may be substantially the same in the in-plane direction and the position of the first abutting surface in the in-plane direction and the position of the second abutting surface in the in-plane direction may be substantially the same. Alternatively, the whole of the first abutting surface and a portion of the second abutting surface may be joined together or a portion of the first abutting surface and the whole of the second abutting surface may be joined together.

Figure 9:
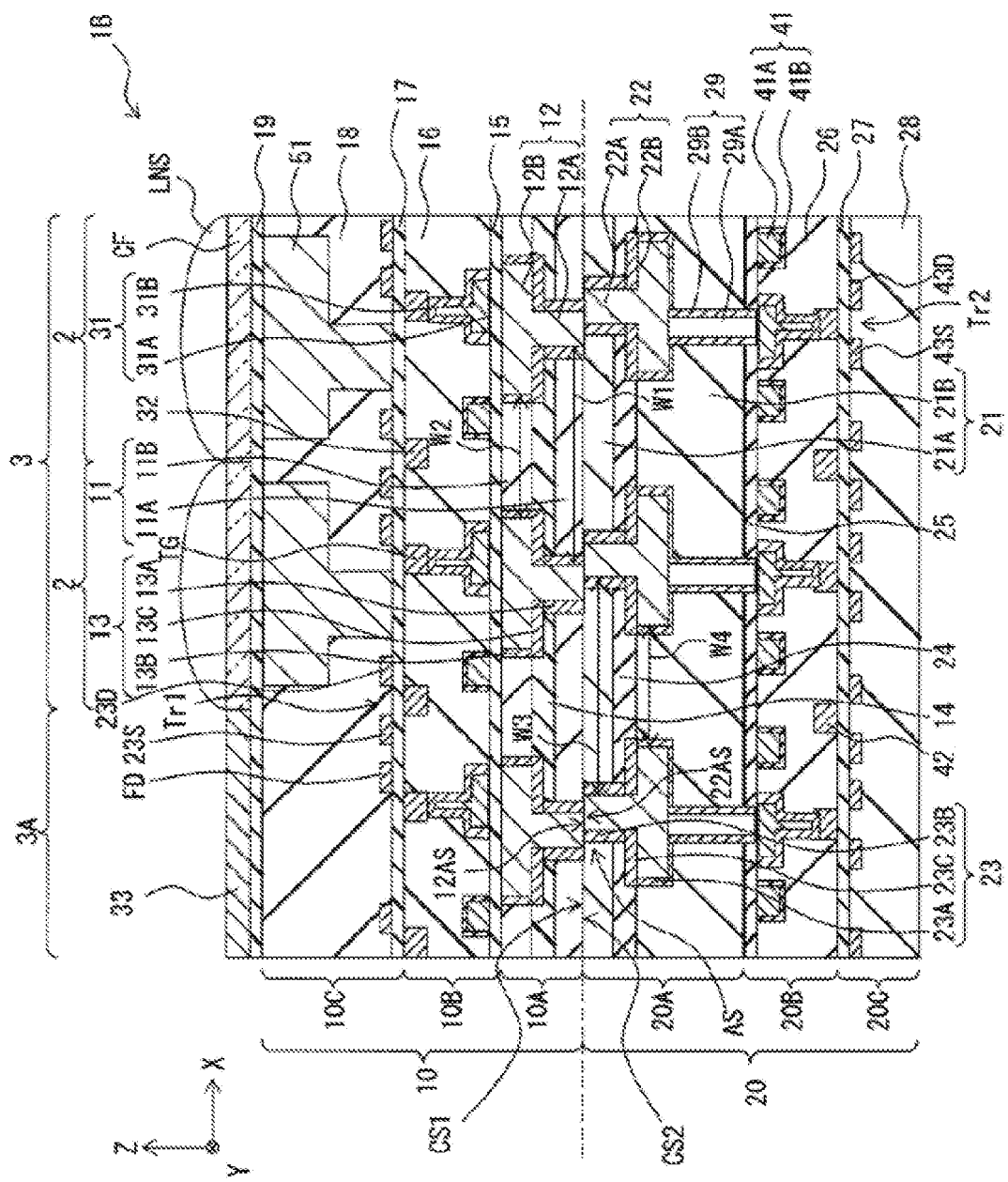
FIG. 9 is a cross-sectional view of an overall configuration example of a solid-state imaging unit according to a second modification example of the present disclosure.

In addition, the case has been exemplified and described in the embodiments and the like described above where the abutting sections AS are formed in a region overlapping with the pixel region 3 in the stack direction, but the present disclosure is not limited to this. For example, as with a solid-state imaging unit 1B according to a second modification example of the present disclosure illustrated in FIG. 9, the abutting sections AS of the first electrode 12 and the second electrode 22 may be formed in a pixel peripheral region 3A other than the region overlapping with the pixel region 3. It is to be noted that the pixel peripheral region 3A may include an optical black region in which a light-shielding film 33 is formed. In addition, a logic circuit that performs signal processing or the like may be formed in the pixel peripheral region 3A on the circuit board 20. The logic circuit in the pixel peripheral region 3A like that includes an analog-digital converter (AD converter), a controller, a data latch section, a parallel-serial conversion section, and the like. The AD converter includes, for example, a comparator, a counter section, and a reference voltage generation section that generates a reference voltage. The comparator compares an analog signal and a reference voltage and transmits an output signal to the counter section. The analog signal is acquired by the imaging element in each of the pixels 2 on the sensor board 10. The reference voltage is generated by the reference voltage generation section. The counter section is supplied with a clock from a clock supply section provided to the controller and operates on the basis of the output signal from the comparator. The data latch section latches the image data digitized by the AD converter. In addition, the parallel-serial conversion section converts the image data outputted from the data latch section from parallel data to serial data.

It is also possible in the solid-state imaging unit 1B like this to decrease the area of each of the junction portions of the first abutting surface 12AS of the first electrode 12 and the second abutting surface 22AS of the second electrode 22. This makes it possible to provide even a finer pixel region with paired coupling terminals for each of pixels or for a desired number of pixels. This makes it possible as a result to contribute to the miniaturization and higher integration of the solid-state imaging unit 1B.

Figure 10:
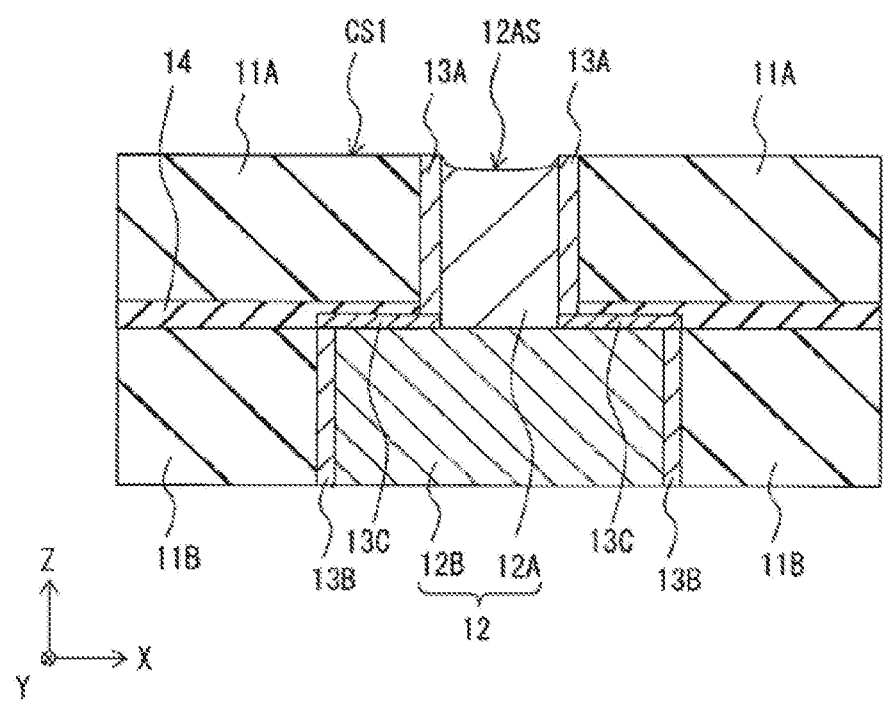
FIG. 10 is an enlarged cross-sectional view of a step of a method of manufacturing a solid-state imaging unit according to a third modification example of the present disclosure.
Figure 11:
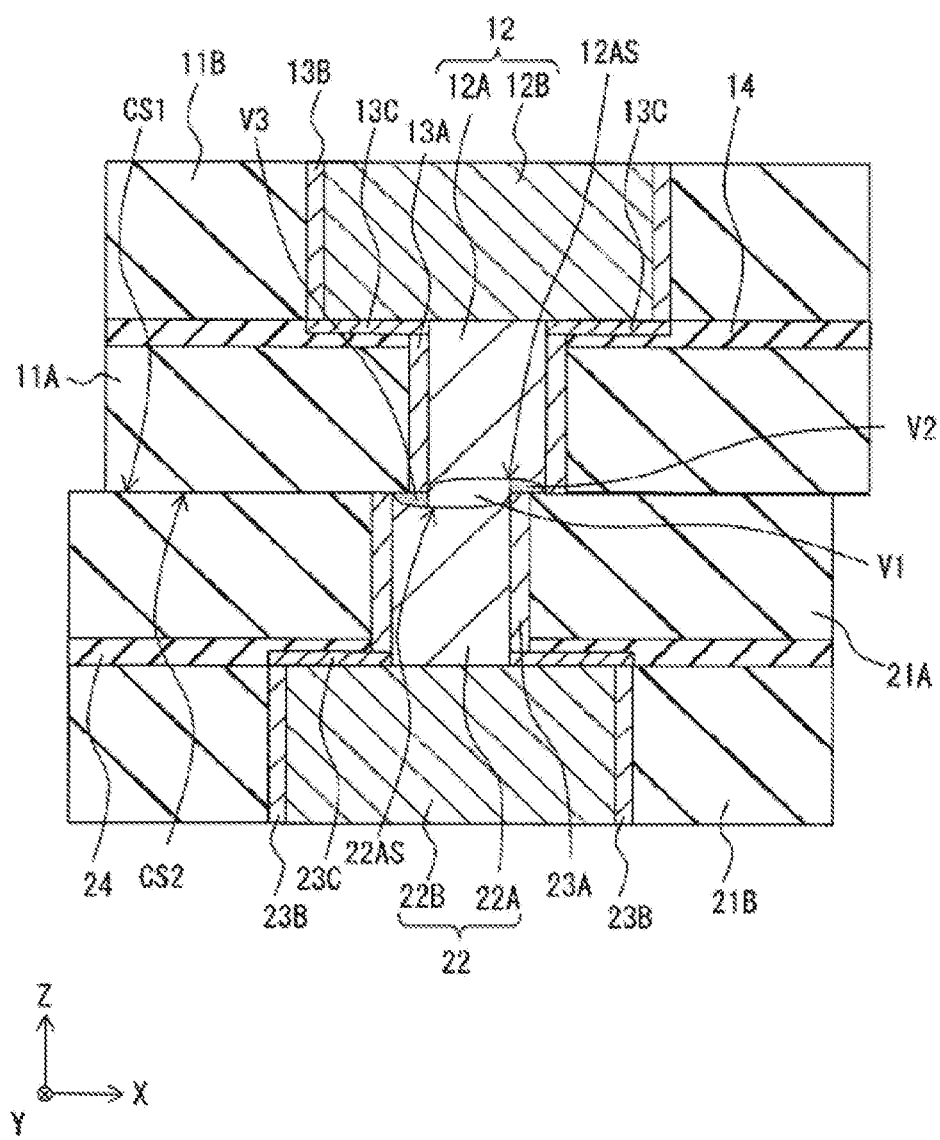
FIG. 11 is an enlarged cross-sectional view of a step subsequent to FIG. 10.

In addition, the case has been described in the embodiments and the like described above where an end of the first abutting surface 12AS and an end of the second abutting surface 22AS each have the recess portion R as illustrated in FIG. 4F or the like, but the present disclosure is not limited to this. The present disclosure is applicable, for example, even in a case where dishing occurs that dents the central portion of the first abutting surface 12AS in the process of manufacturing a solid-state imaging unit as in a third modification example of the present disclosure illustrated in FIG. 10. In a case where the first abutting surface 12AS and the second abutting surface 22AS subjected to dishing in this way are opposed to each other, the first abutting surface 12AS and the second abutting surface 22AS have gaps V1 to V3 in between as in the cross-sectional view illustrated in FIG. 11. It is to be noted that the gap V1 is a space generated at the position at which the first abutting surface 12AS and the second abutting surface 22AS are opposed to each other in the Z axis direction. In addition, the gap V2 is a space formed between the first abutting surface 12AS and a portion of the junction surface CS2 other than the second abutting surface 22AS. Further, the gap V3 is a space formed between the second abutting surface 22AS and a portion of the junction surface CS1 other than the first abutting surface 12AS. In the present disclosure, the first base portion 12B and the second base portion 22B are, however, provided. Performing annealing treatment thus expands the first base portion 12B and the second base portion 22B. As a result, the gaps V1 to V3 are filled to form the abutting sections AS where the first abutting surface 12AS and the second abutting surface 22AS come into contact. It is to be noted that it is sufficient if annealing treatment causes at least the gap V1 to disappear even in a case where dishing occurs in this way. In other words, the gaps V2 and V3 may remain even after annealing treatment. It is to be noted that FIG. 10 is an enlarged cross-sectional view of a step of the method of manufacturing the solid-state imaging unit according to the third modification example of the present disclosure and FIG. 11 is an enlarged cross-sectional view of a step subsequent to FIG. 10.

Figure 12A:
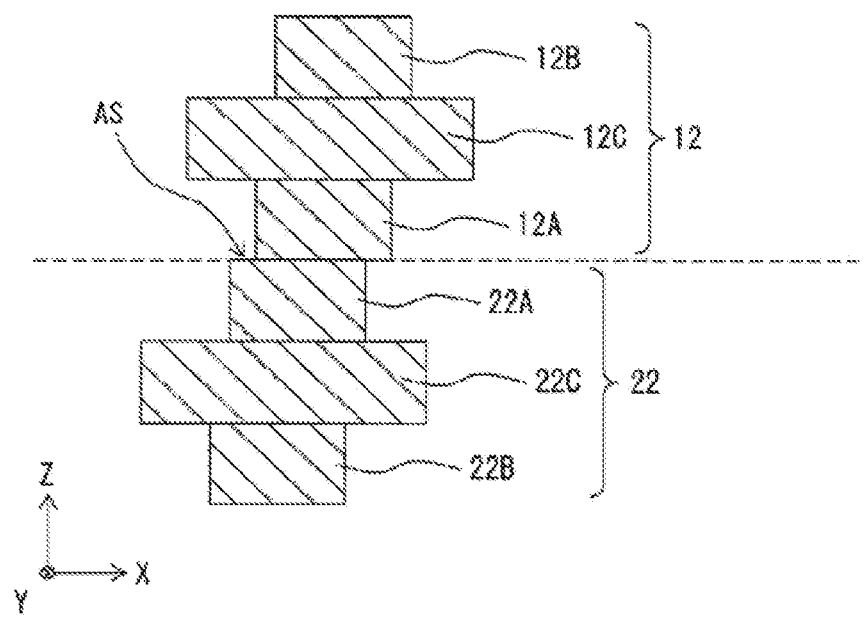
FIG. 12A is an enlarged cross-sectional view of a configuration example of a main section of a solid-state imaging unit according to a fourth modification example of the present disclosure.
Figure 12B:
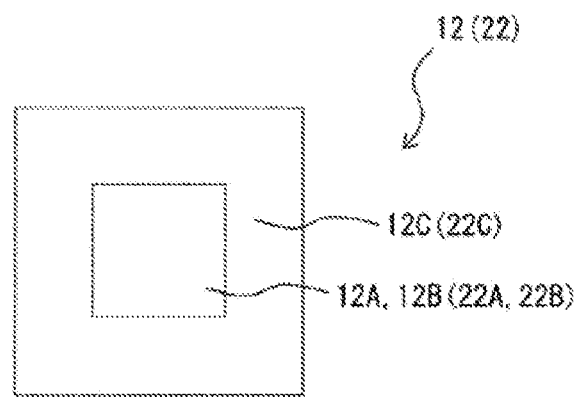
FIG. 12B is an enlarged plan view of a configuration example of the main section of the solid-state imaging unit according to the fourth modification example of the present disclosure.

In addition, the first electrode has a two-layer structure of the first base portion and the first protruding portion in the embodiments and the like described above, but the present disclosure is not limited to this. For example, as with a solid-state imaging unit according to a fourth modification example of the present disclosure illustrated in each of FIGS. 12A and 12B, the first electrode 12 may have a three-layer structure of the first protruding portion 12A including the first abutting surface 12AS, a first middle portion 12C, and the first base portion 12B. The second electrode 22 may similarly have a three-layer structure of the second protruding portion 22A including the second abutting surface 22AS, a second meddle portion 22C, and the second base portion 22B. In the present modification example, a case is exemplified where the plane area of the first middle portion 12C is greater than the plane area of the first protruding portion 12A and the plane area of the first base portion 12B. It is to be noted that FIG. 12A is an enlarged cross-sectional view of a region near the abutting sections AS in the fourth modification example and FIG. 12B is a plan view of the first electrode 12 and the second electrode 22 in the fourth modification example.

Figure 13A:
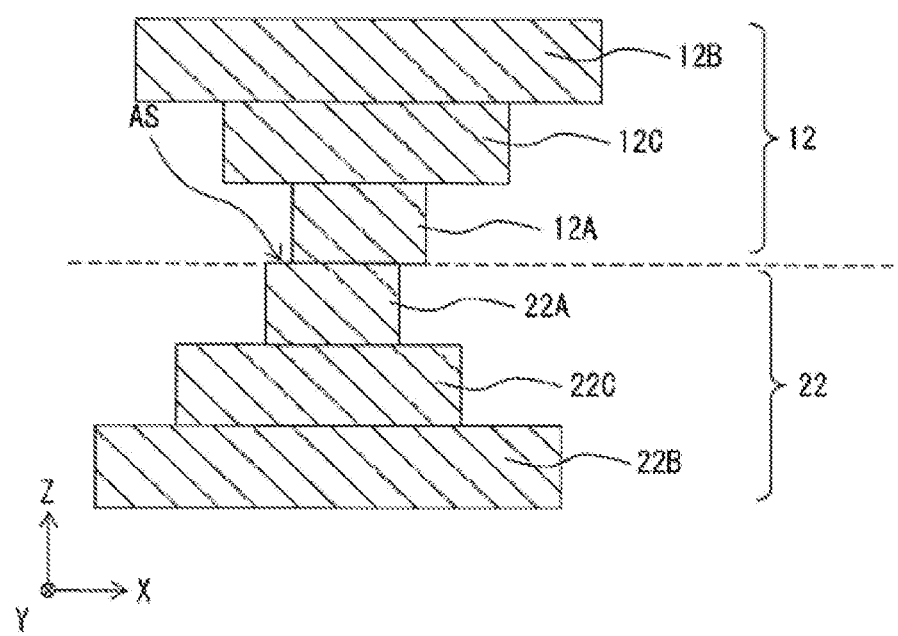
FIG. 13A is an enlarged cross-sectional view of a configuration example of a main section of a solid-state imaging unit according to a fifth modification example of the present disclosure.
Figure 13B:
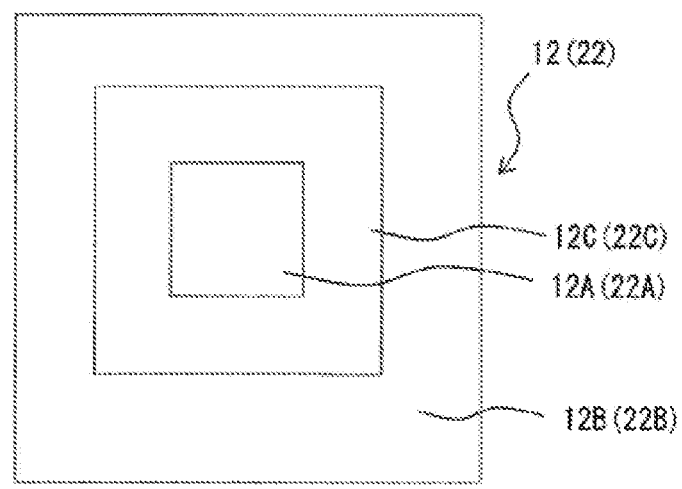
FIG. 13B is an enlarged plan view of a configuration example of the main section of the solid-state imaging unit according to the fifth modification example of the present disclosure.

In a case where the first electrode and the second electrode each have a three-layer structure, the plane area of the first protruding portion 12A may be the smallest, the plane area of the first base portion 12B may be the largest, and the plane area of the first middle portion 12C may be the middle therebetween, for example, as in a fifth modification example of the present disclosure illustrated in each of FIGS. 13A and 13B. The same applies to the second electrode 22. The plane area of the second protruding portion 22A may be the smallest, the plane area of the second base portion 22B may be the largest, and the plane area of the second meddle portion 22C may be the middle therebetween. It is to be noted that FIG. 13A is an enlarged cross-sectional view of a region near the abutting sections AS in the fifth modification example and FIG. 13B is a plan view of the first electrode 12 and the second electrode 22 in the fifth modification example.

Figure 14A:
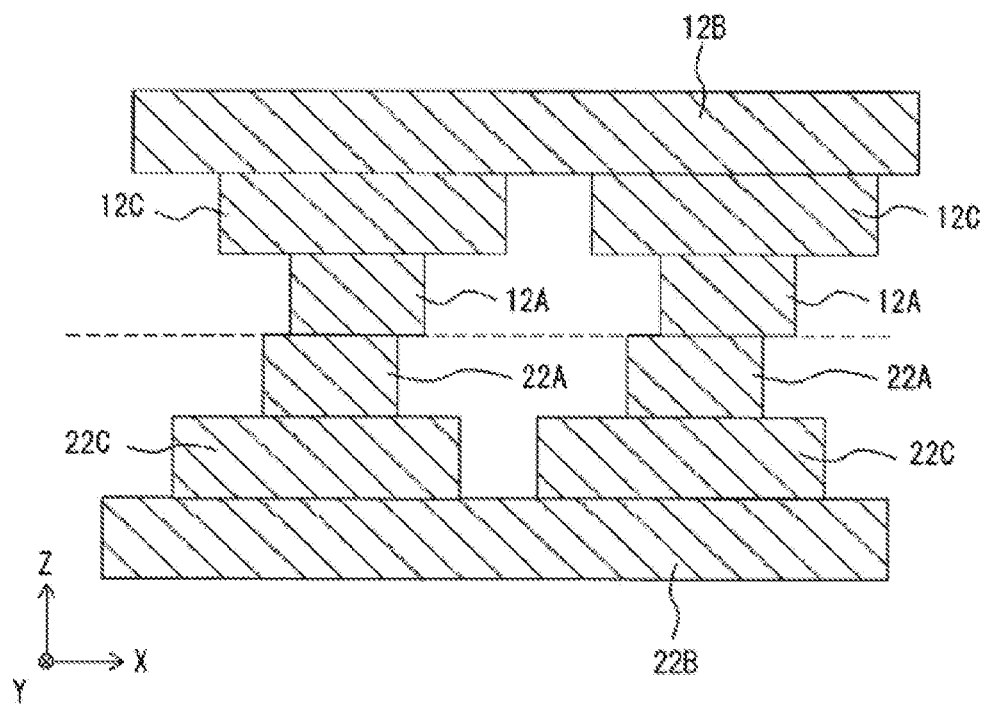
FIG. 14A is an enlarged cross-sectional view of a configuration example of a main section of a solid-state imaging unit according to a sixth modification example of the present disclosure.
Figure 14B:
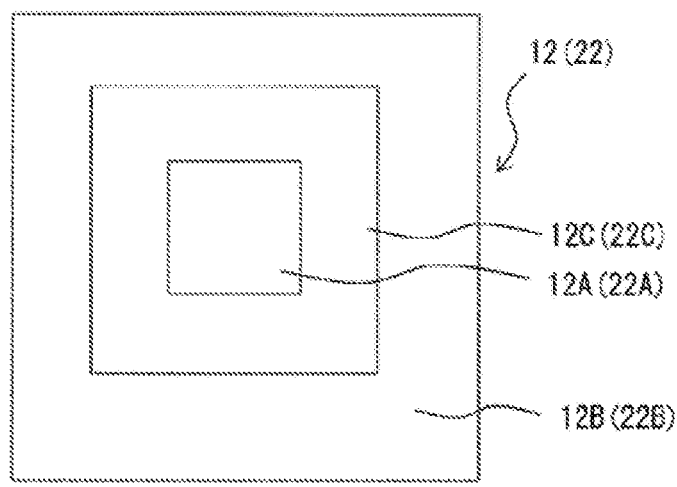
FIG. 14B is an enlarged plan view of a configuration example of the main section of the solid-state imaging unit according to the sixth modification example of the present disclosure.

In a case where the first electrode and the second electrode each have a three-layer structure, for example, the adjacent first electrodes 12 may share the first base portion 12B, for example, as in a sixth modification example of the present disclosure illustrated in each of FIGS. 14A and 14B. The adjacent second electrodes 22 may also share the second base portion 22B. It is to be noted that FIG. 14A is an enlarged cross-sectional view of a region near the abutting sections AS in the sixth modification example and FIG. 14B is a plan view of the first electrode 12 and the second electrode 22 in the sixth modification example.

In addition, in the embodiments and the like described above, the first electrode has a rectangular cross-sectional shape and the second electrode has a rectangular cross-sectional shape, but the present disclosure is not limited to this. A portion or the whole of the first electrode may have a tapered cross section that decreases in width in the in-plane direction of the XY plane as coming closer to the first abutting surface 12AS, for example, as in seventh to ninth modification examples of the present disclosure illustrated in FIGS. 15A, 15B, and 15C. FIG. 15A illustrates an example in which the first protruding portion 12A and the second protruding portion 22A each have a trapezoidal cross section and the first base portion 12B and the second base portion 22B each have a rectangular cross section. (B) of FIG. 15 illustrates an example in which the first protruding portion 12A and the second protruding portion 22A, the first base portion 12B, and the second base portion 22B all have a trapezoidal cross section. FIG. 15C illustrates an example in which the first protruding portion 12A and the second protruding portion 22A each have a rectangular cross section and the first base portion 12B and the second base portion 22B each have a trapezoidal cross section.

Figure 16A:
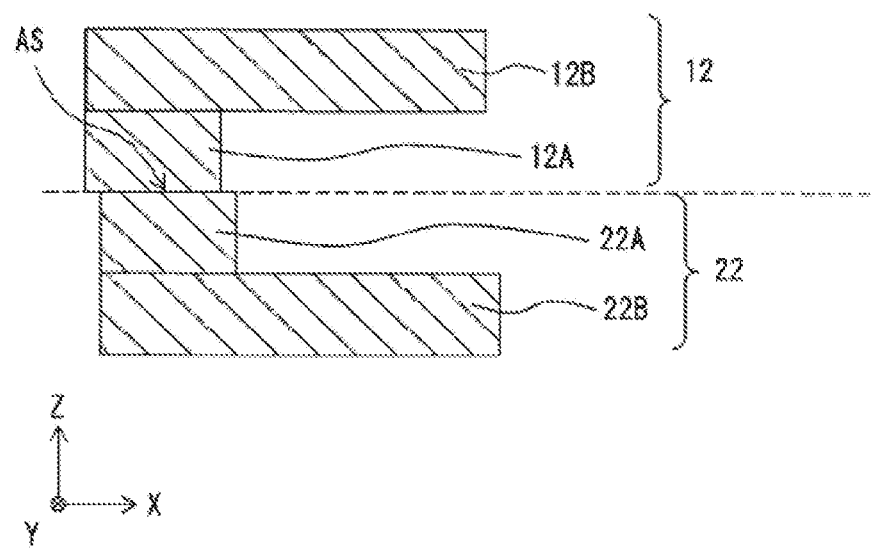
FIG. 16A is an enlarged cross-sectional view of a configuration example of a main section of a solid-state imaging unit according to an eighth modification example of the present disclosure.
Figure 16B:
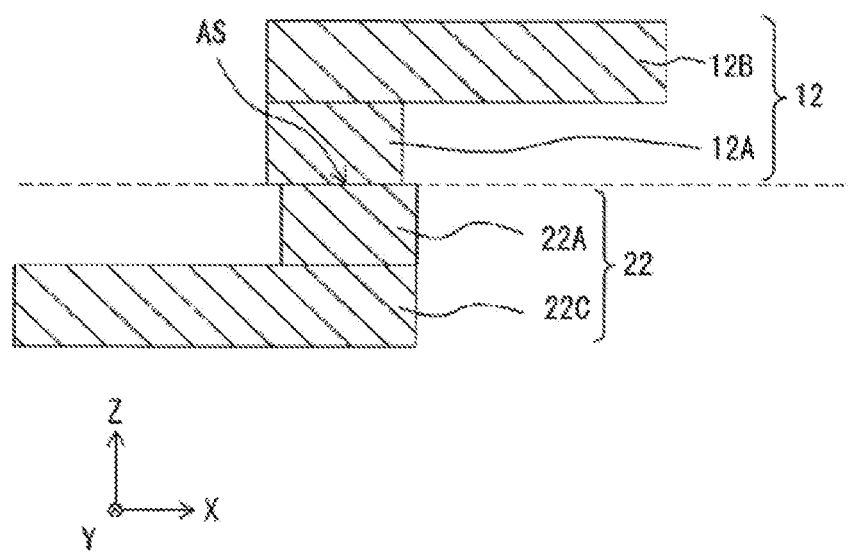
FIG. 16B is an enlarged cross-sectional view of a configuration example of a main section of a solid-state imaging unit according to a ninth modification example of the present disclosure.
Figure 17A:
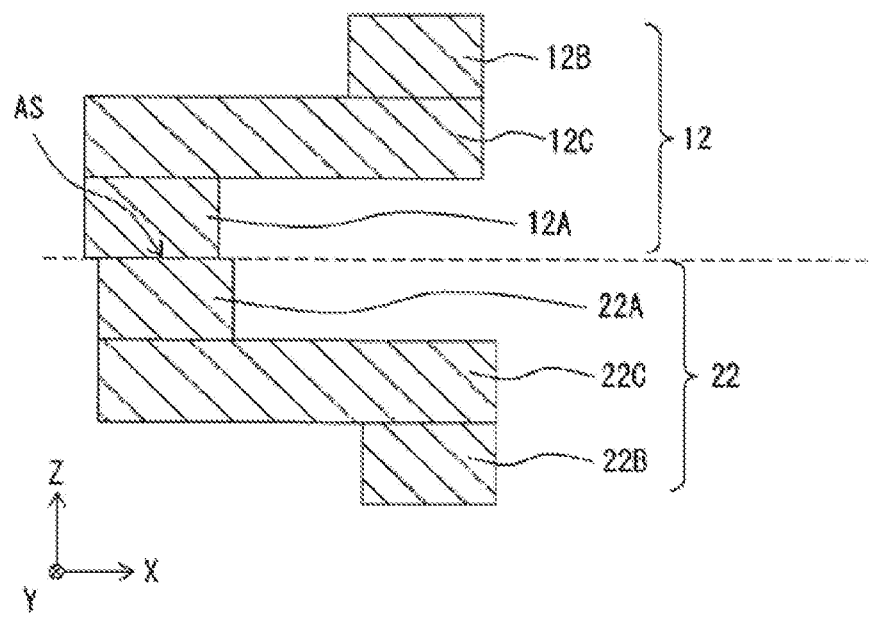
FIG. 17A is an enlarged cross-sectional view of a configuration example of a main section of a solid-state imaging unit according to a tenth modification example of the present disclosure.
Figure 17B:
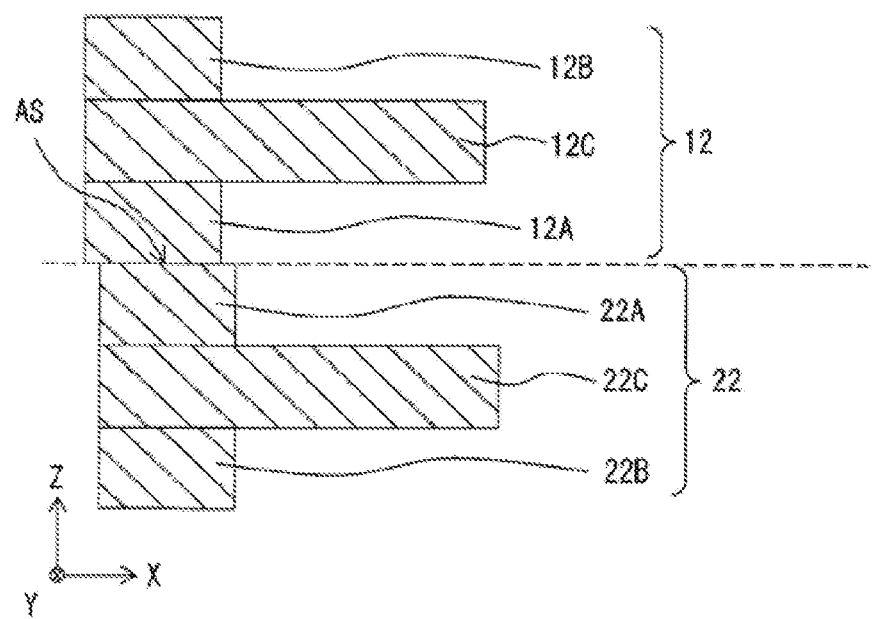
FIG. 17B is an enlarged cross-sectional view of a configuration example of a main section of a solid-state imaging unit according to an eleventh modification example of the present disclosure.

In addition, it is possible in the present disclosure, to set any positional relationship between the first protruding portion, the first middle portion, and the first base portion of the first electrode in the in-plane direction as long as they communicate with each other. The same applies to the second electrode. For example, in a case where the first electrode 12 and the second electrode 22 each have a two-layer structure, the positional relationship between the first protruding portion 12A and the first base portion 12B and the positional relationship between the second protruding portion 22A and the second base portion 22B in the in-plane direction of the XY plane may be, for example, the positional relationships as in FIG. 16A or the positional relationships as in FIG. 16B. In addition, in a case where the first electrode 12 and the second electrode 22 each have a three-layer structure, the positional relationship between the first protruding portion 12A, the first middle portion 12C, and the first base portion 12B and the positional relationship between the second protruding portion 22A, the second meddle portion 22C, and the second base portion 22B in the in-plane direction of the XY plane may be, for example, the positional relationships as in FIG. 17A or the positional relationships as in FIG. 17B. In other words, the first protruding portion 12A may be coupled near the center of the first base portion 12B or the first middle portion 12C in the in-plane direction of the XY plane. Alternatively, the first protruding portion 12A may be coupled near an end of the first base portion 12B or the first middle portion 12C. The same applies to the second electrode 22.

In addition, the first protruding portion and the first base portion or the first protruding portion, the first middle portion, and the first base portion of the first electrode may be separately formed or integrally formed. The same applies to the second electrode.

Figure 18:
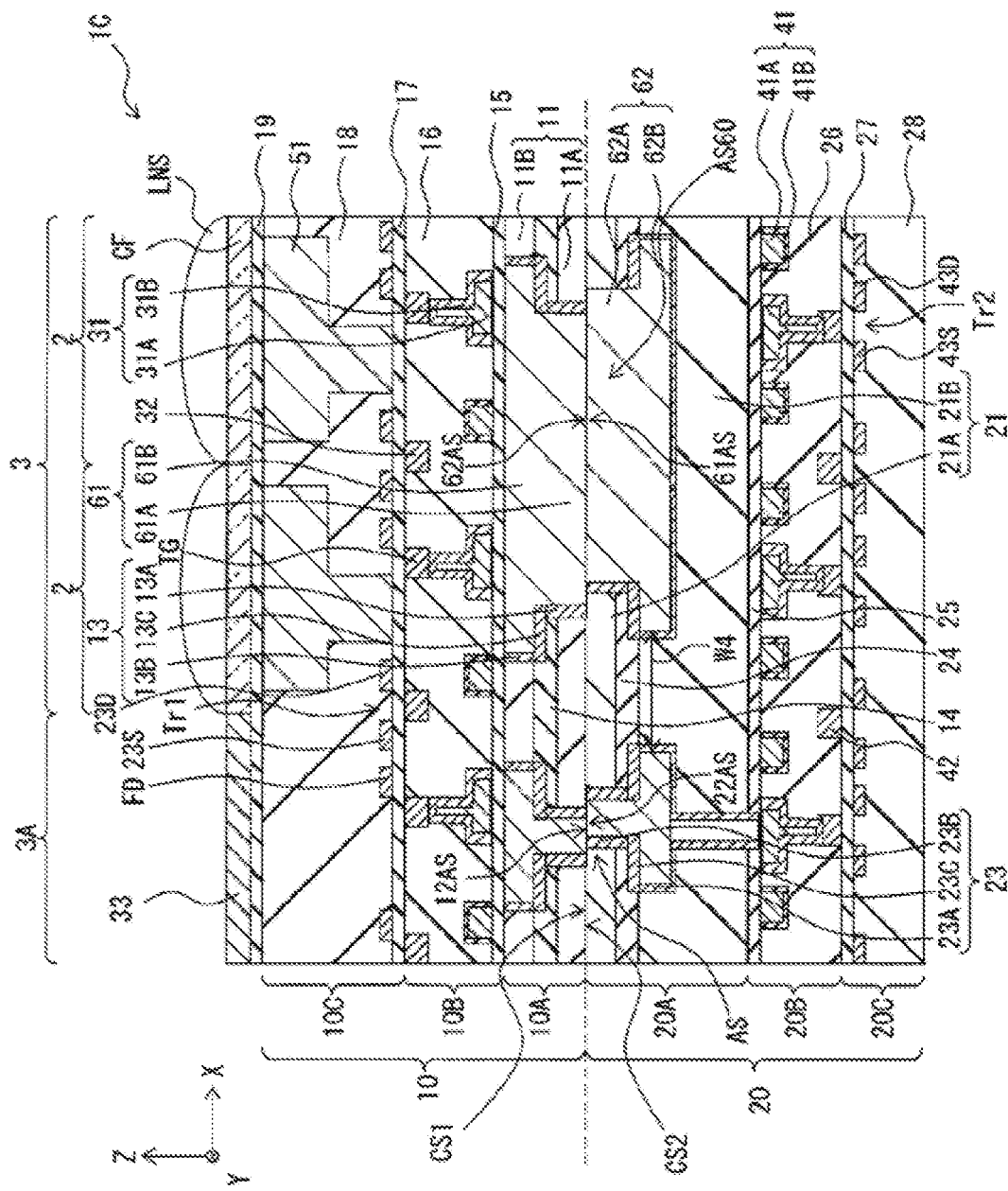
FIG. 18 is an enlarged cross-sectional view of a configuration example of a main section of a solid-state imaging unit according to a twelfth modification example of the present disclosure.

In addition, the case has been exemplified in the embodiments and the like described above where the junction surface of the first electrode and the junction surface of the second electrode are joined together by a technique such as plasma junction to form paired coupling terminals that exchange signals, but the present disclosure is not limited to this. The technology according to the present disclosure is applicable even in a case where not coupling terminals are not joined together, but wiring lines are joined together for forming a power supply path, for example, as with a solid-state imaging unit 1C illustrated in FIG. 18. Specifically, in the solid-state imaging unit 1C, a wiring line 61 on the sensor board 10 includes a first protruding portion 61A and a first base portion 61B and the first protruding portion 61A includes a first abutting surface 61AS exposed from the junction surface CS1. In the solid-state imaging unit 1C, a wiring line 62 on the circuit board 20 further includes a second protruding portion 62A and a second base portion 62B and the second protruding portion 62A includes a second abutting surface 62AS exposed from the junction surface CS2. The first abutting surface 61AS and the second abutting surface 62AS then abut each other to form abutting sections AS60 of the wiring line 61 and the wiring line 62. It is also possible to expect the effects similar to those of the embodiments and the like described above from the solid-state imaging unit 1C according to the present modification example. In other words, it is possible to expect the wiring line 61 and the wiring line 62 to be thinned. This makes it possible as a result to contribute to the miniaturization and higher integration of the solid-state imaging unit 1C. In addition, it is also possible to expect an increase in the strength for joining the wiring line 61 and the wiring line 62.

Further, the technology according to the present disclosure is not limited to a case where coupling terminals are joined together as a path for electrical communication or wiring lines are joined together as a path for power supply, but is applicable, for example, in a case where coupling terminals or wiring lines are joined together as a structure for increasing the strength for joining the sensor board and the circuit board. Further, the technology according to the present disclosure is also applicable, for example, in a case where the respective light-shielding metal layers are joined together that are formed in the pixel region on the sensor board and the pixel region on the circuit board.

As described above, the semiconductor device according to the embodiment of the present disclosure is suitable for higher integration. It is to be noted that the effects described in the present specification are merely illustrative and non-limiting. There may be other effects. In addition, the present technology may have the following configurations.

(1)
A semiconductor device including:
a first semiconductor substrate that is provided with a first electrode including a first protruding portion and a first base portion, the first protruding portion including a first abutting surface, the first base portion being linked to the first protruding portion and having volume greater than volume of the first protruding portion; and
a second semiconductor substrate that is provided with a second electrode including a second protruding portion and a second base portion, the second protruding portion including a second abutting surface that abuts the first abutting surface, the second base portion being linked to the second protruding portion and having volume greater than volume of the second protruding portion, the second semiconductor substrate being stacked on the first semiconductor substrate.

(2)
The semiconductor device according to (1), in which area occupied by the first base portion is greater than area occupied by the first protruding portion in a plane orthogonal to a stack direction of the first semiconductor substrate and the second semiconductor substrate.

(3)
The semiconductor device according to (2), in which area occupied by the second base portion is greater than area occupied by the second protruding portion in the plane orthogonal to the stack direction.

(4)
The semiconductor device according to any one of (1) to (3), in which the first semiconductor substrate includes a pixel region in which a plurality of imaging elements is formed and a peripheral region that surrounds the pixel region, and abutting sections of the first abutting surface and the second abutting surface are formed in a region that overlaps with the pixel region in a stack direction of the first semiconductor substrate and the second semiconductor substrate.

(5)
The semiconductor device according to any one of (1) to (4), in which the first abutting surface and the second abutting surface form abutting sections that are joined together by using plasma junction.

(6)
The semiconductor device according to any one of (1) to (5), in which the second electrode includes a plurality of the second protruding portions linked to the one second base portion.

(7)
The semiconductor device according to any one of (1) to (6), further including: a first barrier layer that surrounds the first electrode in an in-plane direction orthogonal to a stack direction of the first semiconductor substrate and the second semiconductor substrate; and a second barrier layer that surrounds the second electrode in the in-plane direction.

(8)
A method of manufacturing a semiconductor device, the method including: polishing a first abutting surface after a first semiconductor substrate is prepared, the first semiconductor substrate being provided with a first electrode including a first protruding portion and a first base portion, the first protruding portion including the first abutting surface, the first base portion being linked to the first protruding portion and having volume greater than volume of the first protruding portion;

polishing a second abutting surface after a second semiconductor substrate is prepared, the second semiconductor substrate being provided with a second electrode including a second protruding portion and a second base portion, the second protruding portion including the second abutting surface, the second base portion being linked to the second protruding portion and having volume greater than volume of the second protruding portion;

superimposing the second semiconductor substrate on the first semiconductor substrate and joining the second semiconductor substrate to the first semiconductor substrate to cause the polished first abutting surface and the polished second abutting surface to be opposed to each other; and electrically coupling the first protruding portion and the second protruding portion by heating the first semiconductor substrate and the second semiconductor substrate that have been joined together.

(9)

An imaging element including:

a first semiconductor substrate including a photoelectric conversion section and a first electrode; and a second semiconductor substrate that is stacked on the first semiconductor substrate, the second semiconductor substrate including a logic circuit and a second electrode, in which the first electrode includes a first portion and a second portion, the second portion being adjacent to the first portion in a stack direction of the first semiconductor substrate and the second semiconductor substrate, the second electrode includes a third portion and a fourth portion, the third portion being joined to the first portion, the fourth portion being adjacent to the third portion in the stack direction, a first width of the first portion in an in-plane direction orthogonal to the stack direction is smaller than a second width of the second portion in the in-plane direction, and a third width of the third portion in the in-plane direction is smaller than a fourth width of the fourth portion in the in-plane direction.

(10)

The imaging element according to (9), in which the first semiconductor substrate further includes a third electrode that is disposed adjacent to the first electrode in the in-plane direction, the third electrode includes a fifth portion and a sixth portion, the sixth portion being adjacent to the fifth portion in the stack direction, a fifth width of the fifth portion in the in-plane direction is smaller than a sixth width of the sixth portion in the in-plane direction, and a first distance between the first portion and the fifth portion is equal to or greater than a second distance between the second portion and the sixth portion.

The present application claims the priority on the basis of Japanese Patent Application No. 2018-189792 filed on Oct. 5, 2018 with Japan Patent Office, the entire contents of which are incorporated in the present application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A semiconductor device, comprising:
   a first semiconductor substrate that has a first electrode including a first protruding portion and a first base portion, wherein
   the first protruding portion includes a first abutting surface,
   the first base portion is linked to the first protruding portion, and
   a volume of the first base portion is greater than a volume of the first protruding portion; and
   a second semiconductor substrate that has a second electrode including a second protruding portion and a second base portion, wherein
   the second protruding portion includes a second abutting surface that abuts the first abutting surface,
   the second base portion is linked to the second protruding portion,
   a volume of the second base portion is greater than a volume of the second protruding portion, and
   the second semiconductor substrate is stacked on the first semiconductor substrate.

2. The semiconductor device according to claim 1, wherein area corresponding to the first base portion is greater than area corresponding to the first protruding portion in a plane orthogonal to a stack direction of the first semiconductor substrate and the second semiconductor substrate.

3. The semiconductor device according to claim 2, wherein area corresponding to the second base portion is greater than area corresponding to the second protruding portion in the plane orthogonal to the stack direction.

4. The semiconductor device according to claim 1, wherein
   the first semiconductor substrate includes a pixel region and a peripheral region that surrounds the pixel region,
   the pixel region comprises a plurality of imaging elements, and
   abutting sections of the first abutting surface and the second abutting surface are in a region that overlaps with the pixel region in a stack direction of the first semiconductor substrate and the second semiconductor substrate.

5. The semiconductor device according to claim 1, wherein plasma junction joins abutting sections of the first abutting surface and abutting sections of the second abutting surface.

6. The semiconductor device according to claim 1, wherein the second electrode includes a plurality of second protruding portions linked to the second base portion.

7. The semiconductor device according to claim 1, further comprising:
   a first barrier layer that surrounds the first electrode in an in-plane direction orthogonal to a stack direction of the first semiconductor substrate and the second semiconductor substrate; and
   a second barrier layer that surrounds the second electrode in the in-plane direction.

8. A method of manufacturing a semiconductor device, the method comprising:
   polishing a first abutting surface after a first semiconductor substrate is prepared, wherein
   the first semiconductor substrate is provided with a first electrode including a first protruding portion and a first base portion,
   the first protruding portion includes the first abutting surface,
   the first base portion is linked to the first protruding portion, and
   a volume of the first base portion is greater than a volume of the first protruding portion;
   polishing a second abutting surface after a second semiconductor substrate is prepared, wherein
   the second semiconductor substrate is provided with a second electrode including a second protruding portion and a second base portion,
   the second protruding portion includes the second abutting surface,
   the second base portion is linked to the second protruding portion, and
   a volume of the second base portion is greater than a volume of the second protruding portion;
   superimposing the second semiconductor substrate on the first semiconductor substrate and joining the second semiconductor substrate to the first semiconductor substrate, wherein the polished first abutting surface is opposite to the polished second abutting surface; and electrically coupling the first protruding portion and the second protruding portion by heating the first semiconductor substrate and the second semiconductor substrate that have been joined together.

9. An imaging element, comprising:

a first semiconductor substrate including a photoelectric conversion section and a first electrode; and a second semiconductor substrate stacked on the first semiconductor substrate, wherein the second semiconductor substrate includes a logic circuit and a second electrode, the first electrode includes a first portion and a second portion, the second portion is adjacent to the first portion in a stack direction of the first semiconductor substrate and the second semiconductor substrate, the second electrode includes a third portion and a fourth portion, the third portion is joined to the first portion, the fourth portion is adjacent to the third portion in the stack direction, a first width of the first portion in an in-plane direction orthogonal to the stack direction is smaller than a second width of the second portion in the in-plane direction, a third width of the third portion in the in-plane direction is smaller than a fourth width of the fourth portion in the in-plane direction, the first semiconductor substrate further includes a third electrode that is adjacent to the first electrode in the in-plane direction, the third electrode includes a fifth portion and a sixth portion, the sixth portion is adjacent to the fifth portion in the stack direction, and a fifth width of the fifth portion in the in-plane direction is smaller than a sixth width of the sixth portion in the in-plane direction.

10. The imaging element according to claim 9, wherein a first distance between the first portion and the fifth portion is equal to or greater than a second distance between the second portion and the sixth portion.

* * * * *